(12) United States Patent
Aoki et al.

(10) Patent No.: US 8,154,073 B2
(45) Date of Patent: Apr. 10, 2012

(54) SEMICONDUCTOR DEVICE

(75) Inventors: Takaaki Aoki, Okazaki (JP); Tetsuo Fujii, Toyohashi (JP); Tomofusa Shiga, Gamagori (JP)

(73) Assignee: DENSO CORPORATION, Kariya (JP)

( * ) Notice: Subject to any disclaimer, the term of this patent is extended or adjusted under 35 U.S.C. 154(b) by 855 days.

(21) Appl. No.: 11/826,206

(22) Filed: Jul. 12, 2007

(65) Prior Publication Data
US 2008/0012050 A1  Jan. 17, 2008

(30) Foreign Application Priority Data

Jul. 14, 2006 (JP) .................................. 2006-194527
Apr. 25, 2007 (JP) .................................. 2007-115581

(51) Int. Cl.
*H01L 29/80* (2006.01)
(52) U.S. Cl. .......................... 257/330; 257/449; 257/331
(58) Field of Classification Search .................. 257/155, 257/330, 331, 341, 342, 499, 479; 438/179, 438/268, 270
See application file for complete search history.

(56) References Cited

U.S. PATENT DOCUMENTS

| | | | |
|---|---|---|---|
| 4,903,189 A | 2/1990 | Ngo et al. | |
| 5,856,692 A | 1/1999 | Williams et al. | |
| 6,351,018 B1 | 2/2002 | Sapp | |
| 6,521,538 B2 | 2/2003 | Soga et al. | |
| 6,593,620 B1 | 7/2003 | Hshieh et al. | |
| 6,621,107 B2 | 9/2003 | Blanchard et al. | |
| 6,707,128 B2 | 3/2004 | Moriguchi et al. | |
| 6,762,098 B2 | 7/2004 | Hshieh et al. | |
| 6,777,783 B2 | 8/2004 | Matsuda | |
| 6,818,940 B2 | 11/2004 | Matsuda | |
| 6,979,863 B2 | 12/2005 | Ryu | |
| 7,154,145 B2 | 12/2006 | Takahashi | |
| 7,687,902 B2 | 3/2010 | Shiraishi et al. | |
| 8,008,711 B2 | 8/2011 | Takahashi | |
| 2004/0155287 A1* | 8/2004 | Omura et al. | 257/328 |
| 2005/0167742 A1* | 8/2005 | Challa et al. | 257/328 |

(Continued)

FOREIGN PATENT DOCUMENTS

JP  A-01-192174  8/1989

(Continued)

OTHER PUBLICATIONS

Office Action mailed Dec. 27, 2011 in corresponding JP Application No. 2006-194527 (and English translation).

*Primary Examiner* — Lynne Gurley
*Assistant Examiner* — Naima Kearney
(74) *Attorney, Agent, or Firm* — Posz Law Group, PLC

(57) ABSTRACT

A semiconductor device includes: a semiconductor substrate; a vertical type trench gate MOS transistor; a Schottky barrier diode; multiple trenches having a stripe pattern to divide an inner region into first and second separation regions; and a poly silicon film in each trench. The first separation region includes a first conductive type region for providing a source and a second conductive type layer for providing a channel region. The first conductive type region is adjacent to a first trench. The poly silicon film in the first trench is coupled with a gate wiring. A second trench is not adjacent to the first conductive type region. The poly silicon film in the second trench is coupled with a source or gate wiring. The substrate in the second separation region is coupled with the source wiring for providing a Schottky barrier.

17 Claims, 25 Drawing Sheets

U.S. PATENT DOCUMENTS

| | | |
|---|---|---|
| 2005/0236664 A1 | 10/2005 | Aoki et al. |
| 2006/0284217 A1* | 12/2006 | Kumar et al. .................. 257/266 |
| 2007/0120201 A1* | 5/2007 | Yamaguchi et al. .......... 257/401 |
| 2007/0262410 A1 | 11/2007 | Ono et al. |
| 2010/0117225 A1 | 5/2010 | Shiraishi et al. |

FOREIGN PATENT DOCUMENTS

| | | |
|---|---|---|
| JP | A-2001-230412 | 8/2001 |
| JP | 2006-210392 A | 8/2006 |

* cited by examiner

→ ENERGIZATION
----▶ RETURN

US 8,154,073 B2

SEMICONDUCTOR DEVICE

CROSS REFERENCE TO RELATED APPLICATIONS

This application is based on Japanese Patent Applications No. 2006-194527 filed on Jul. 14, 2006, and No. 2007-115581 filed on Apr. 25, 2007, the disclosures of which are incorporated herein by reference.

FIELD OF THE INVENTION

The present invention relates to a semiconductor device.

BACKGROUND OF THE INVENTION

Inverter circuits for driving a load such as a motor for use in a vehicle are DC to AC converters; that is, they convert a DC voltage to an AC voltage and supply the latter to a load such as a motor. An inverter circuit for driving a motor which is inductive is composed of a MOS transistor (hereinafter abbreviated as MOS) or an insulated-gate bipolar transistor (hereinafter abbreviated as IGBT) as a switching element and a free-wheel diode (hereinafter abbreviated as FWD). The FWD bypasses and returns a current that flows through the motor while the MOS is off so that the current flowing through the motor is not varied by switching of the MOS. More specifically, when the MOS which has connected a DC power source to the motor and has applied a voltage to the motor is turned off, a current that has flown through the motor causes a reverse flow of a DC current through the FWD because of energy that is stored in the inductance L of the motor, establishing a state that is equivalent to a state that a reverse DC voltage is applied to the motor. This makes it possible to supply an AC voltage from the DC power source to the motor by switching without cutting off the motor current abruptly by switching of the MOS. To enable such ah operation, the inverter circuit requires the FWD which is connected to the MOS in parallel in opposite direction. In the above inverter circuit, the MOS which functions as the switching element is required to be low in both on-resistance and switching loss. As for the FWD, the recovery characteristic and the forward loss are important characteristics.

Where a MOSFET or an IGBT which is a switching element is formed as a vertical MOS transistor having a trench gate structure (switching element), a p-type layer to serve as a channel forming region of the transistor is formed in a main-surface-side surface layer of an n-type semiconductor substrate. It is therefore possible to form a (body) diode utilizing an interface pn junction and use it as a FWD. In this structure, the vertical MOS transistor and the body diode are disposed adjacent to each other, as a result of which the semiconductor device is basically given a good switching characteristic. However, the body diode which is formed in the above manner has problems of a long recovery time and a large forward loss.

To solve the problems of the body diode which utilizes the pnjunction, the use of a Schottky barrier diode (hereinafter abbreviated as SBD) is being studied. For example, JP-A-2002-373989 (corresponding to U.S. Pat. No. 6,707,128) discloses a semiconductor device in which a vertical MOS transistor having a trench gate structure and an SBD are formed adjacent to each other on a semiconductor substrate.

FIG. 18 shows the configuration of the conventional semiconductor device disclosed in JP-A-2002-373989, that is, it is a schematic sectional view of a semiconductor device 90. FIG. 18 shows several cells of an NMOSFET (hereinafter abbreviated as MOS) transistor having a trench gate structure and an SBD which are formed on an $n^+/n^-$ substrate.

In the semiconductor device 90 of FIG. 18, a p-type base layer 12 is selectively formed in a surface layer of an $n^-$ layer 11 of the $n^+/n^-$ substrate in a MOS forming area 14 and an $n^+$ source region 13 is selectively formed in a surface layer of the p-type base layer 12. Gate trenches are formed so as to extend in the depth direction from the surface of the $n^+$ source region 13 and to reach the $n^-$ layer 11. An SBD forming area 28 is disposed so as to surround the p-type base layer 12 of the MOS forming area 14 continuously, for example. A guard ring region 17 is formed so as to surround the SBD forming area 28 by the same process as the p-type base layer 12 is formed.

An interlayer insulating film 19 is deposited on the substrate in the MOS forming area 14, and plural contact holes are formed through the interlayer insulating film 19 at prescribed positions. A barrier metal 21 is formed on the surface of the $n^-$ layer 11 in the SBD forming area 28 and the surfaces of those portions of the $n^+$ source region 13 which correspond to the contact holes formed through the interlayer insulating film 19. The barrier metal 21 is in Schottky contact with the surface of the $n^-$ layer 11 in the SBD forming area 28 and is in ohmic contact with the surfaces (high-concentration regions) of the portions of the $n^+$ source region 13. Furthermore, a first main electrode 1 made of a metal to serve as both of an anode electrode of the SBD and a source electrode of the MOS is formed on the barrier metal 21. A second main electrode 22 to serve as both of a cathode electrode of the SBD and a drain electrode of the MOS is formed on almost the entire chip back surface.

Configured in such a manner that the MOS and the SBD are connected to each other in parallel in opposite directions, the semiconductor device 90 of FIG. 18 can be applied to the above-described inverter circuit with the SBD used as an FWD. Having a lower threshold voltage than pnjunction diodes such as the above-described body diode, when used as the FWD, the SBD is superior in the recovery characteristic and can lower the forward loss.

On the other hand, whereas the above-described body diode is formed by utilizing the p-type layer (corresponding to the p-type base layer 12 shown in FIG. 18) to serve as the MOS channel forming area, in the semiconductor device 90 of FIG. 18 the independent SBD forming area 28 is provided so as to continuously surround the p-type base layer 12 which exists in the MOS forming area 14. Therefore, the semiconductor device 90 has problems that the switching characteristic is basically bad and the chip cost is high because of an increased chip area.

One method for suppressing the increase of the chip area of the semiconductor device 90 is to increase the intervals between the gate trenches in the MOS forming area 14 and dispose an SBD between the adjoining gate trenches. However, this configuration raises another problem that the increased intervals between the gate trenches lower the breakdown voltage of the MOS. Furthermore, in this configuration, since the MOS and the SBD are disposed in a limited area, the individual regions of the p-type base layer 12 of the MOS need to be sufficiently narrow taking lateral diffusion into consideration. However, since the p-type base layer 12 of the MOS corresponds to the bases of parasitic bipolar transistors, parasitic operations tend to occur unless the individual regions of the p-type base layer 12 are sufficiently wide. This means a problem that the L load surge resistance is low.

Thus, it is desired to provide a semiconductor device in which a vertical MOS transistor having a trench gate structure and a Schottky barrier diode are formed adjacent to each other on a single semiconductor substrate, and which is superior in the diode recovery characteristic and can lower the forward loss, is free of reduction in transistor breakdown voltage and surge resistance, is superior in the switching characteristic, and is small in size and inexpensive.

FIG. 28 is a sectional view of a conventional semiconductor device which is equipped with a vertical MOSFET having a trench gate structure. As shown in FIG. 28, an n⁻ drift layer J2 and a p-type base layer J3 are formed on an n⁺ silicon substrate J1. Plural n⁺ source regions J4 are formed in surface portions of the base layer J3. The silicon substrate J1, the drift layer J2, the base layer J3, and the source regions J4 constitute a semiconductor substrate J5. Trenches J6 are formed in the semiconductor substrate J5 so as to penetrate through the base layer J3 and reach the drift region J2. Silicon oxide films (gate oxide films) J7 are formed so as to cover the inner wall surfaces of the trenches J6, respectively, and gate electrodes J8 are formed on the surfaces of the silicon oxide films J7 so as to be buried in the trenches J6, respectively. Trench gates are thus formed.

A BPSG film J9 is formed so as to cover the gate electrodes J8, and a source electrode J10 is formed so as to be electrically connected to the source regions J4 and the base layer J3 through contact holes that are formed through the BPSG film J9. A drain electrode J11 is formed on the back-surface side of the semiconductor substrate J5. The semiconductor device which is equipped with the MOSFET having the trench gate structure is thus constructed (refer to JP-A-2005-333112, for example).

In the MOSFET having the above structure, since the base layer J3 necessarily exists between the trenches, body diodes which are formed by the pn junctions of the p-type base layer J3 and the combination of the n-type drift layer J2 and the silicon substrate J1 are disposed between the trenches. Where the semiconductor devices having the above structure are applied to an H-bridge circuit such as a motor drive circuit and the individual MOSFETs are on/off-driven by a PWM control, a return current flows through the body diodes of the MOSFETs located on the high side, which causes a return current loss which is mainly due to Vf of the body diodes.

Thus, it ie required for a semiconductor device to reduce a return current loss which is mainly due to Vf of a body diode.

SUMMARY OF THE INVENTION

In view of the above-described problem, it is an object of the present disclosure to provide a semiconductor device having variable operating information.

According to a first aspect, a semiconductor device includes: a semiconductor substrate having a first conductive type, wherein the substrate has a principal surface and a backside surface, and wherein the substrate includes an inner region and a periphery region; a vertical type trench gate MOS transistor disposed in a surface portion of the principal surface in the inner region of the substrate; a Schottky barrier diode disposed in another surface portion of the principal surface in the inner region of the substrate; a plurality of trenches disposed on the principal surface of the substrate; and a poly silicon film filled in each trench through an insulation film between the poly silicon film and an inner wall of the trench. The plurality of trenches have a stripe pattern without crossing each other so that the inner region on the principal surface of the substrate is divided into a plurality of separation regions by the plurality of trenches. The plurality of separation regions includes a first separation region and a second separation region. The first separation region includes a first conductive type region and a second conductive type layer disposed on the principal surface of the substrate. The second conductive type layer provides a channel region of the MOS transistor. The first conductive type region is disposed on a surface portion of the second conductive type layer, and adjacent to one trench so that the one trench provides a first trench. The first conductive type region provides a source of the MOS transistor. The poly silicon film in the first trench is coupled with a gate wiring of the MOS transistor. The plurality of trenches further includes a second trench, which is not adjacent to the first conductive type region. The poly silicon film in the second trench is coupled with a source wiring or the gate wiring of the MOS transistor. The substrate in the second separation region is exposed on the principal surface in such a manner that the substrate is coupled with the source wiring of the MOS transistor. The source wiring and the substrate in the second separation region provide a Schottky barrier in the Schottky barrier diode.

In the device, the MOS transistor and the Schottky barrier diode are reversely coupled with each other. Accordingly, the device can provide a switching element in an inverter circuit. In this case, the Schottky barrier diode has a low threshold voltage, compared with a PN junction diode. Thus, a recovery property and a forward direction loss in the Schottky barrier diode are improved.

Further, since the MOS transistor and the Schottky barrier diode are proximately arranged, so that a switching property is improved, and further, dimensions and a manufacturing cost of the device are reduced. Furthermore, by designing a width between two trenches appropriately, a withstand voltage of the MOS transistor is improved. Further, since the second conductive type layer for providing the channel region of the MOS transistor is limited to diffuse in a lateral direction of the substrate by the trench, impurity concentration is easily controlled, and a parasitic operation of a parasitic bipolar transistor is reduced so that a load surge breakdown voltage is improved.

Thus, the recovery property and the forward direction loss are improved, and the withstand voltage and the surge breakdown voltage in the transistor are also improved. Thus, the switching property in the device is improved, and the dimensions of the device are small.

According to a second aspect, a semiconductor device includes: a semiconductor substrate having a first conductive type, wherein the substrate includes a first surface and a second surface, and has a first portion and a second portion; a drift layer having the first conductive type, wherein the drift layer is disposed in a surface portion of the first surface of the substrate; a vertical MOSFET disposed in the first portion of the substrate; and an accumulation FET for operating in an accumulation mode and disposed in the second portion of the substrate. The vertical MOSFET includes: the drift layer; a base layer having a second conductive type, wherein the base layer is disposed in the drift layer; a source region having the first conductive type, wherein the source region is disposed in the base layer in such a manner that the source region is separated from the drift layer by the base layer; a first gate insulation film disposed between the source region and the drift layer through the base layer; a first gate electrode disposed on the first gate insulation film, wherein the first gate electrode provides a channel in a part of the base layer, which contacts the first gate insulation film; a source electrode electrically coupling with the source region and the base layer; and a drain electrode disposed on the second surface of the substrate. The accumulation FET includes: a second trench disposed in the drift layer; a second gate insulation film disposed on an inner wall of the second trench; and a second gate electrode disposed on the second gate insulation film in the second trench, wherein a part of the drift layer contacting the second trench is coupled with the source electrode of the vertical MOSFET.

In the above device, a return current flows through the accumulation FET instead of the MOSFET. Thus, loss caused by a Vf of a body diode is reduced.

According to a third aspect, a semiconductor device includes: a semiconductor substrate having a first conductive type, wherein the substrate includes a first surface and a second surface, and has a first portion and a second portion; a drift layer having the first conductive type, wherein the drift layer is disposed in a surface portion of the first surface of the substrate; a vertical MOSFET disposed in the first portion of the substrate; and a J-FET disposed on the second portion of the substrate. The vertical MOSFET includes: the drift layer; a base layer having a second conductive type, wherein the base layer is disposed in the drift layer; a source region having the first conductive type, wherein the source region is disposed in the base layer in such a manner that the source region is separated from the drift layer by the base layer; a first gate insulation film disposed between the source region and the drift layer through the base layer; a first gate electrode disposed on the first gate insulation film, wherein the first gate electrode provides a channel in a part of the base layer, which contacts the first gate insulation film; a source electrode electrically coupling with the source region and the base layer; and a drain electrode disposed on the second surface of the substrate. The J-FET includes: a second trench disposed in the drift layer; a second conductive type layer disposed in the drift layer and surrounding the second trench; and a second gate electrode coupled with the second conductive type layer, wherein a part of the drift layer contacting the second trench is coupled with the source electrode of the vertical MOSFET.

In the above device, a return current flows through the J-FET instead of the MOSFET. Thus, loss caused by a Vf of a body diode is reduced.

BRIEF DESCRIPTION OF THE DRAWINGS

The above and other objects, features and advantages of the present invention will become more apparent from the following detailed description made with reference to the accompanying drawings. In the drawings:

FIG. 9 shows still another exemplary semiconductor device, that is, it is a schematic plan view showing an exemplary planar pattern of an important part of a semiconductor device 100a;

FIG. 10 shows another exemplary semiconductor device, that is, it is a schematic plan view showing an exemplary planar pattern of an important part of a semiconductor device 101a;

FIG. 11 shows another exemplary semiconductor device, that is, it is a schematic plan view showing an exemplary planar pattern of an important part of a semiconductor device 102a;

DETAILED DESCRIPTION OF THE PREFERRED EMBODIMENTS

First Embodiment

Figure 1:
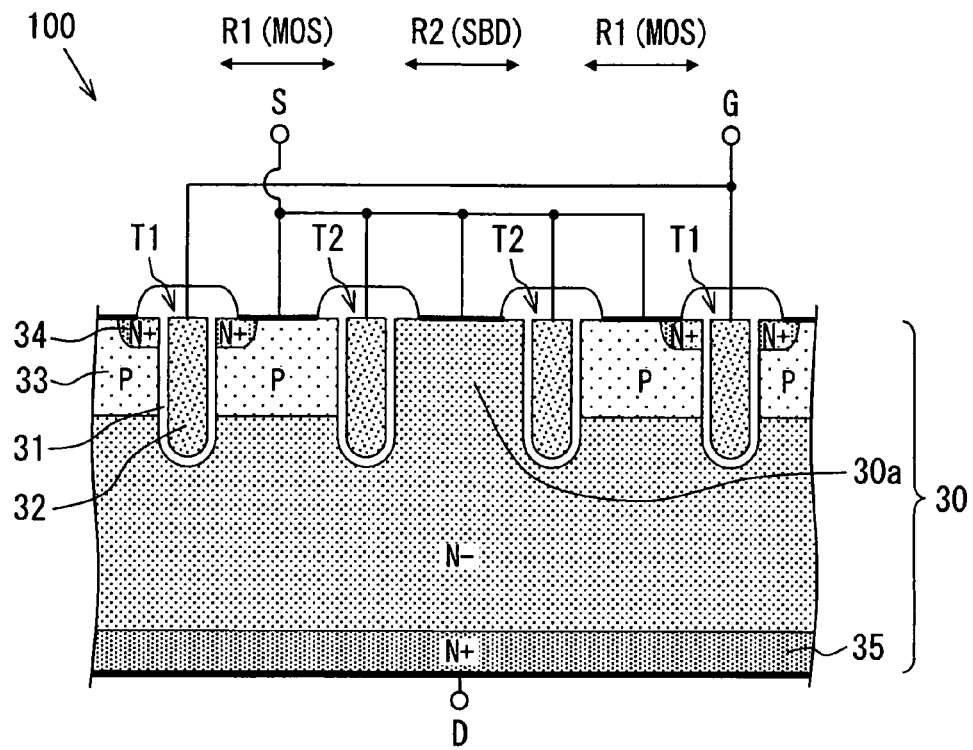
FIG. 1 shows an exemplary semiconductor device, that is, it is a schematic sectional view of a semiconductor device 100.
Figure 2:
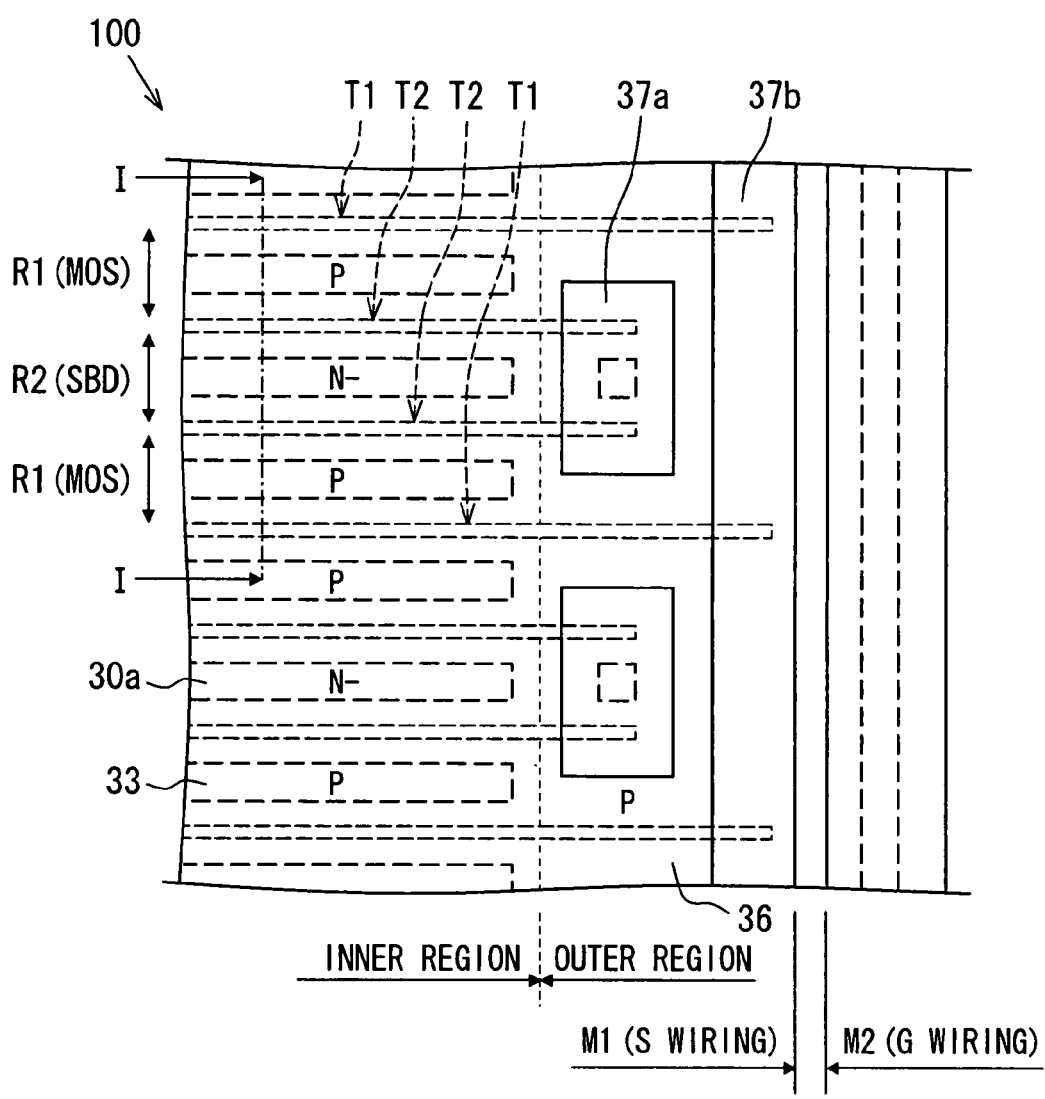
FIG. 2 is a schematic plan view-showing an exemplary planar pattern of an important part of the semiconductor device 100 of FIG. 1, and a sectional view taken along a chain line I-I in FIG. 2 corresponds to FIG. 1.

FIG. 1 shows an exemplary semiconductor device, that is, it is a schematic sectional view of a semiconductor device 100. FIG. 2 is a schematic plan view showing an exemplary planar pattern of an important part of the semiconductor device 100 of FIG. 1, and a sectional view taken along a chain line I-I in FIG. 2 corresponds to FIG. 1.

The semiconductor device 100 shown in FIGS. 1 and 2 is a semiconductor device in which a vertical MOS transistor (hereinafter abbreviated as MOS) having a trench gate structure and a Schottky barrier diode (hereinafter abbreviated as SBD) are formed adjacent to each other on an n-type ($n^-$) semiconductor substrate 30. Although in the following example the vertical MOS transistor is an NMOSFET (n-channel metal oxide semiconductor field-effect transistor), it may be an IGBT (insulated-gate bipolar transistor) in which a p-type layer is provided on the back-surface side of the semiconductor substrate 30.

In the semiconductor device 100, as shown in FIG. 1, plural buried trenches T1 and T2 in each of which polysilicon 32 is buried via an insulating film 31 are formed adjacent to the main surface of the semiconductor substrate 30. The polysilicon 32 in each trench is doped so as to exhibit $n^+$ conductivity. The intervals between the buried trenches T1 and T2 are 2 to 5 μm, for example. Among the plural buried trenches T1 and T2, the first buried trenches T1 are buried trenches that function as gate electrodes of the MOS and the second buried trenches T2 are buried trenches that do not function as gate electrodes of the MOS.

As shown in FIG. 2, the plural buried trenches T1 and T2 are formed along plural straight lines that exist in the substrate surface and are parallel with each other. A prescribed inner region (see FIG. 2) adjacent to the main surface of the semiconductor substrate 30 is divided (partitioned) into plural partitioned regions R1 and R2 by the plural buried trenches T1 and T2. An outer region which surrounds the inner region (see FIG. 2) is a p-type region 36 which is formed at the same time as p-type layers 33 (described later) or by a process that is separate from a process for forming the p-type layers 33.

Among the plural partitioned regions R1 and R2, the first partitioned regions R1 are regions that are parts of the MOS and the second partitioned regions R2 are regions that are parts of the SBD. In each first partitioned region R1, a p-type layer 33 to serve as a channel-forming region of the MOS is formed in a main-surface-side portion of the semiconductor substrate 30. An n-type ($n^+$) region 34 as a source region of the MOS is formed in a surface portion of the p-type layer 33 adjacent to the first buried trench T1. On the other hand, in each second partitioned region R2, an n-type ($n^-$) layer 30a which is part of the semiconductor substrate 30 is exposed in the main surface. An n-type ($n^+$) layer 35 to be connected to a drain (D) electrode of the MOS and a cathode electrode of the SBD which are a common electrode is formed in a back-surface-side surface layer of the semiconductor substrate 30. Although in FIG. 1 the n-type ($n^+$) layer 35 is drawn so as to be thinner than the n-type ($n^-$) layer 30a, the semiconductor substrate 30 may be such as to be obtained by forming a thin n-type ($n^-$) layer 30a by epitaxial growth on a thick wafer as the n-type ($n^+$) layer 35. In the semiconductor device 100, the n-type ($n^-$) layer 30a functions as a carrier drift layer for the MOS and the SBD.

The polysilicon in the first buried trenches T1 which function as the gate electrodes of the MOS among the plural buried trenches T1 and T2 is connected to a gate (G) interconnection of the MOS. Those portions of the n-type layer 30a which are exposed in the surface in the second partitioned regions R2 are connected together to a source (S) interconnection of the MOS, whereby Schottky barriers of the SBD are formed in contact portions (indicated by a thick line in FIG. 1). In the semiconductor device 100 of FIG. 1, the polysilicon in the second buried trenches T2 which are not adjacent to the n-type ($n^+$) regions 34 (the source regions of the MOS) and do not function as gate electrodes is connected to the source (s) interconnection of the MOS.

In the semiconductor device 100, as shown in FIG. 2, a first metal layer M1 which is the source (S) interconnection of the MOS is formed so as to cover the prescribed inner region from above the main surface of the semiconductor substrate 30. A second metal layer M2 which is the gate (G) interconnection of the MOS is formed so as to surround the first metal layer M1. This structure allows the first metal layer M1 as the source interconnection to be connected to the source regions in a shortest length and also allows the first metal layer M1 to have a large area. As a result, reduced in wiring resistance, the semiconductor device 100 can be made a large-capacity power device.

In the semiconductor device 100, as described above, the polysilicon in the second buried trenches T2 is connected to the source (S) interconnection of the MOS. To this end, in the semiconductor device 100, as shown in FIG. 2, the polysilicon in the second buried trenches T2 is connected to the overlaid first metal layer M1 as the source interconnection of the MOS via polysilicon layers 37a which are formed on the semiconductor substrate 30 outside the prescribed inner region and are connected directly to the polysilicon in the second buried trenches T2. The polysilicon in the first buried trenches T1 is connected to the overlaid second metal layer M2 as the gate interconnection of the MOS via a polysilicon layer 37b which is formed on the semiconductor substrate 30 in the outer region and is connected directly to the polysilicon in the first trenches T1. Portions enclosed by thick broken lines in FIG. 2 are contact portions of the first and second metal layers M1 and M2.

Next, a manufacturing method of the semiconductor device 100 of FIGS. 1 and 2 will be described briefly.

First, an n-type ($n^-$) layer 30a to become the drift layer is formed by epitaxial growth on an $n^+$ semiconductor substrate to become the n-type ($n^+$) layer 35 shown in FIG. 1. Then, a p-type region 36 to become the outer voltage withstanding region shown in FIG. 2 is formed so as to occupy a prescribed surface portion of the n-type ($n^-$) layer 30a. Then, p-type layers 33 are formed by ion implantation and thermal diffusion. Then, an oxide film to serve as a mask for formation of first buried trenches T1 and second buried trenches T2 is deposited by CVD at a thickness of about 1 μm. Subsequently, prescribed portions (where trenches are to be formed) of the oxide film are removed selectively by photolithography and dry etching. At this time, as shown in FIG. 2, the patterning is performed so that second buried trenches T2 become shorter than first buried trenches T1 and the ends of the former are located inside those of the latter. Dry etching is then performed to form trenches (the depth of the trenches is set at 1 to 3 µm in the case of a MOS and at 4 to 6 µm in the case of an IGBT). Then, after damage elimination treatment (also serves as treatment for rounding the trench corners) such as chemical dry etching or pseudo-oxidation is performed, insulating films 31 (see FIG. 1) are formed by thermal oxidation. Then, polysilicon 32 doped with an impurity is buried in the trenches by CVD and deposited on the substrate 30 (alternatively, the impurity may be introduced after depositing non-doped polysilicon). Then, polysilicon layers 37a and 37b (see FIG. 2) are formed by patterning by dry etching. At this time, the polysilicon layer 37b is formed in such a manner as to cover end portions of the first buried trenches T1 in the gate lead-out regions of the first buried trenches T1. Outside the inner region (cell region), the polysilicon layers 37a are formed by patterning so as to cover end portions of the second buried trenches T2. The trench mask oxide film is thereafter removed by dry etching. At this time, the patterning is performed so that the trench mask oxide film is removed only in the inner region (cell region), that is, it is not removed in the gate, lead-out regions and a field region. Subsequently, p-type layers 33 to become channel forming layers of the MOS are formed in the first partitioned regions R1 between the first buried trenches T1 and the second buried trenches T2. Then, n-type (n$^+$) regions 34 to become source regions of the MOS are formed in surface layer portions of the p-type layers 33 in the same first partitioned regions R1. Then, an interlayer insulating film is formed and contact holes are formed. At this time, contact holes for connection to the source are formed over the respective polysilicon layers 37a which cover the end portions of the second buried trenches T2. Then, a first metal layer M1 and a second metal layer M2 are formed with aluminum (Al) or the like. As a result, the polysilicon 32 in the second buried trenches T2 is connected to the source interconnection via the contact holes. Subsequently, the wafer thickness is reduced by grinding the back surface and a back-surface drain electrode (see FIG. 1) is formed.

In the semiconductor device 100 of FIGS. 1 and 2, the MOS and the SBD are formed adjacent to each other on the single semiconductor substrate 30 and are connected to each other in opposite directions. Therefore, as described above, the semiconductor device 100 can be used, as it is, as a switching device of an inverter circuit. In such a case, being lower in threshold voltage than pnjunction diodes, the SBD of the semiconductor device 100 is superior in the recovery characteristic and can reduce the forward loss.

Figure 18:
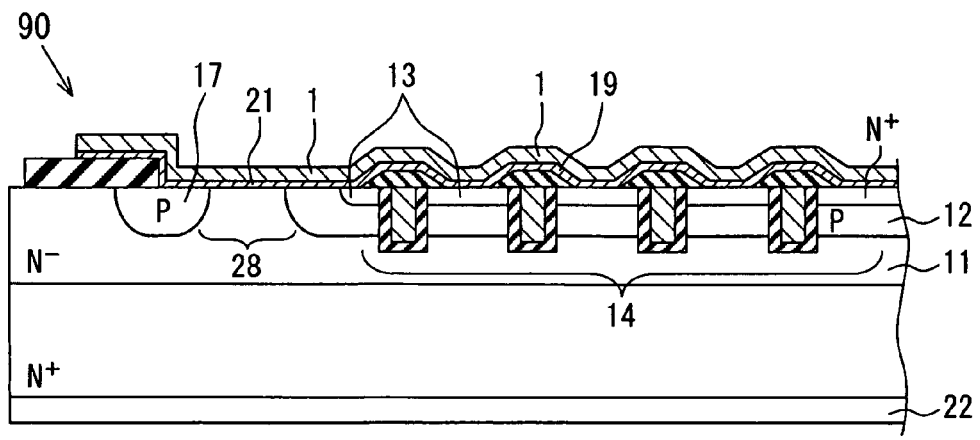
FIG. 18 shows the configuration of a conventional semiconductor device, that is, it is a schematic sectional view of a semiconductor device 90.

In the semiconductor device 100 of FIGS. 1 and 2, the MOS and the SBD are formed close to each other in the partitioned regions R1 and R2, separated from each other by the buried trenches T1 and T2, of the single inner region rather than in isolated, different areas as in case of the semiconductor device 90 of FIG. 18. Therefore, the semiconductor device 100 of FIGS. 1 and 2 can be a small, inexpensive semiconductor device having a superior switching characteristic. Furthermore, properly setting, in a range of 2 to 5 µm, the intervals between the plural buried trenches T1 and T2 which partition the inner region makes it possible to suppress electric field concentration on the bottom portions of the trenches during reverse biasing and to suppress reduction of the breakdown voltage of the MOS formed in the partition regions R1.

As for the p-type layers 33 which serve as the channel forming regions of the MOS, lateral diffusion is restricted by the buried trenches T1 and T2 as shown in FIG. 1. Therefore, it is not necessary to secure margins for lateral diffusion in forming the p-type layers 33, which contributes to reduction of the device size. Furthermore, since the impurity concentration of the p-type layers 33 can be controlled easily, reduction of the L load surge resistance can be prevented by suppressing parasitic operations of parasitic bipolar transistors.

As described above, the semiconductor device 100 of FIGS. 1 and 2 can be made a small semiconductor device in which the vertical MOS transistor having the trench gate structure and the Schottky barrier diode are formed adjacent to each other on the single semiconductor substrate 30, and which is superior in the diode recovery characteristic and can lower the forward loss, is free of reduction in transistor breakdown voltage and surge resistance, and is superior in the switching characteristic.

The plural buried trenches T1 and T2 of the semiconductor device 100 are parallel with each other and straight, as a result of which breakdown voltage designing etc. are facilitated and the semiconductor device 100 is made highly reliable and inexpensive. However, semiconductor devices capable of providing the same advantages as the semiconductor device 100 does can be obtained by modifying the semiconductor device 100. For example, the plural buried trenches may be curved; satisfactory results are obtained as long as the plural buried trenches extend along plural lines that do not intersect each other in the substrate surface.

In the semiconductor device 100, among the plural partitioned regions R1 and R2, partitioned by the plural buried trenches T1 and T2, of the inner region (see FIG. 2), first partitioned regions R1 are disposed on both sides of each second partitioned region R2. In this manner, elements of the MOS are disposed on both sides of each SBD. As a result, the time taken by carrier movements between the MOS and the SBD is shortened, whereby the semiconductor device 100 is made superior particularly in the switching characteristic. Alternatively, for example, the plural buried trenches may be curved and the arrangement of the first partitioned regions R1 where the MOS is formed and the second partitioned regions R2 where the SBD is formed is arbitrary.

Figure 3:
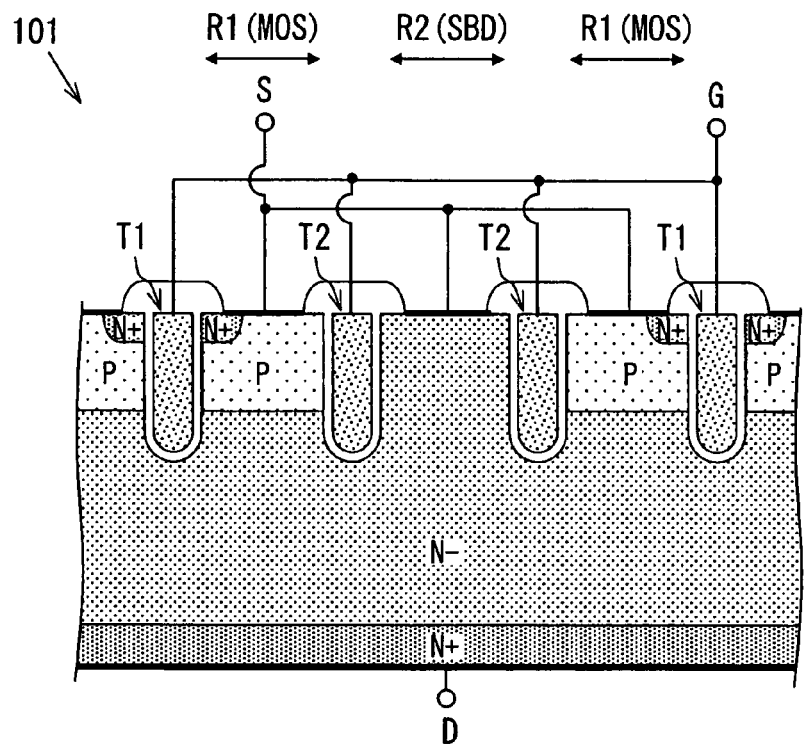
FIG. 3 shows another exemplary semiconductor device, that is, it is a schematic sectional view of a semiconductor device 101.
Figure 4:
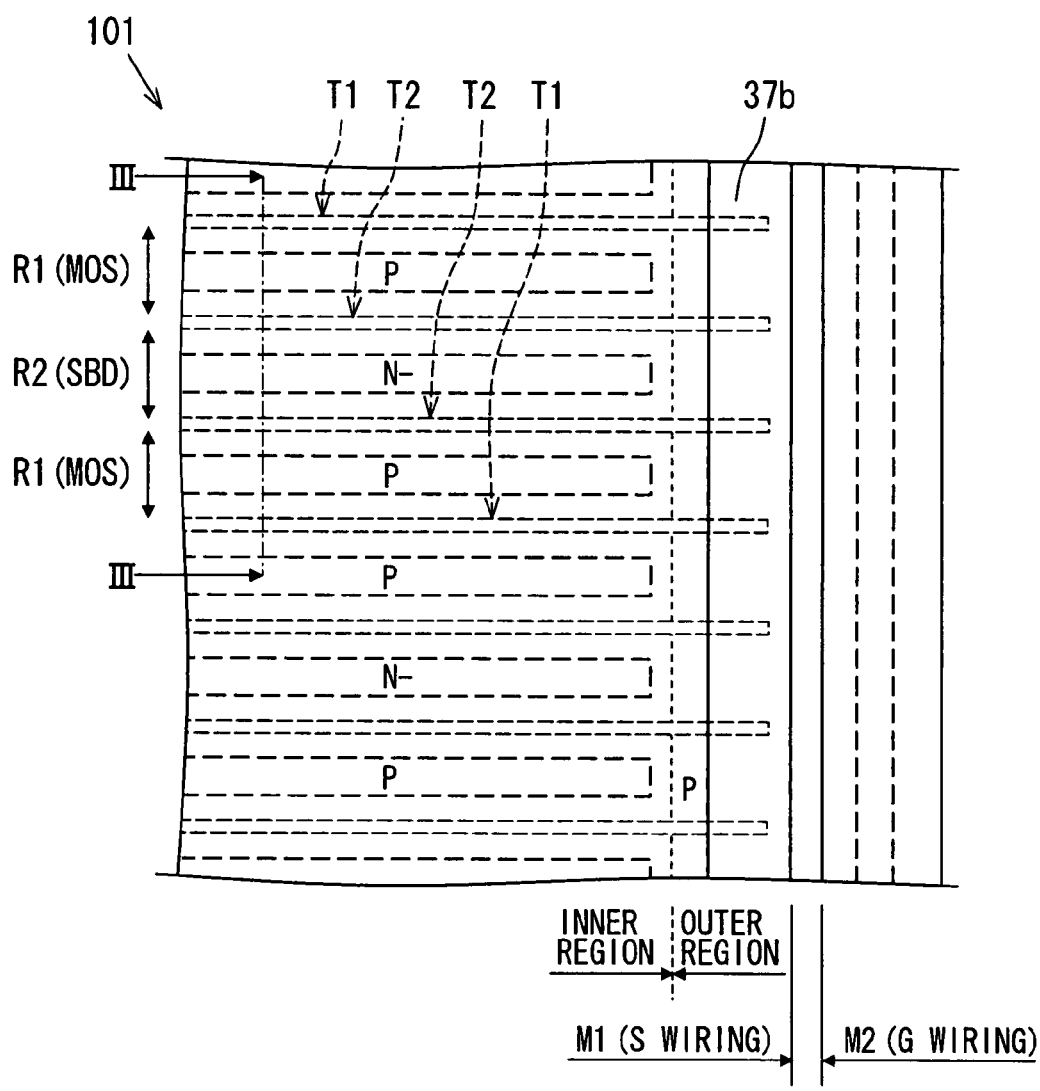
FIG. 4 is a schematic plan view showing an exemplary planar pattern of an important part of the semiconductor device 101 of FIG. 3, and a sectional view taken along a chain line III-III in FIG. 4 corresponds to FIG. 3.

FIG. 3 shows another exemplary semiconductor device, that is, it is a schematic sectional view of a semiconductor device 101. FIG. 4 is a schematic plan view showing an exemplary planar pattern of the semiconductor device 101 of FIG. 3, and a sectional view taken along a chain line III-III in FIG. 4 corresponds to FIG. 3. Portions of the semiconductor device 101 of FIGS. 3 and 4 are given the same symbols as corresponding portions of the semiconductor device 100 of FIGS. 1 and 2.

Whereas the semiconductor device 101 of FIG. 3 has the same sectional structure as the semiconductor device 100 of FIG. 1, they are different from each other in the manner of connection of the second buried trenches T2. In the semiconductor device 100 of FIG. 1, the second buried trenches T2 are connected to the source (S) interconnection of the MOS. In contrast, in the semiconductor device 101 of FIG. 3, the second buried trenches T2 are connected to the gate (G) interconnection of the MOS.

The polysilicon in the second buried trenches T2 of the semiconductor device is connected to the source interconnection or the gate interconnection so that it is given the same potential (zero potential) as the polysilicon in the first buried trenches T1 as the gate electrodes while the MOS is off. Where the second buried trenches T2 are connected to the source (S) interconnection of the MOS as in the semiconductor device 100 of FIG. 1, an unnecessary parasitic (gate) capacitance is less prone to be attached to the gate of the MOS than in the case where they are connected to the gate (G)

interconnection. This is preferable in being able to suppress reduction of the switching speed of the MOS and to reduce the switching loss.

On the other hand, where the second buried trenches T2 are connected to the gate (G) interconnection of the MOS like the first buried trenches T1, the wiring structure is simplified and hence the semiconductor device can be made smaller. For example, in the semiconductor device 101, as shown in FIG. 4, the polysilicon in the first buried trenches T1 and the second buried trenches T2 is connected to the gate (G) interconnection of the MOS via the polysilicon layer 37b which is formed on the semiconductor substrate outside the prescribed inner region and is connected directly to the polysilicon in first buried trenches T1 and the second buried trenches T2.

Figure 5:
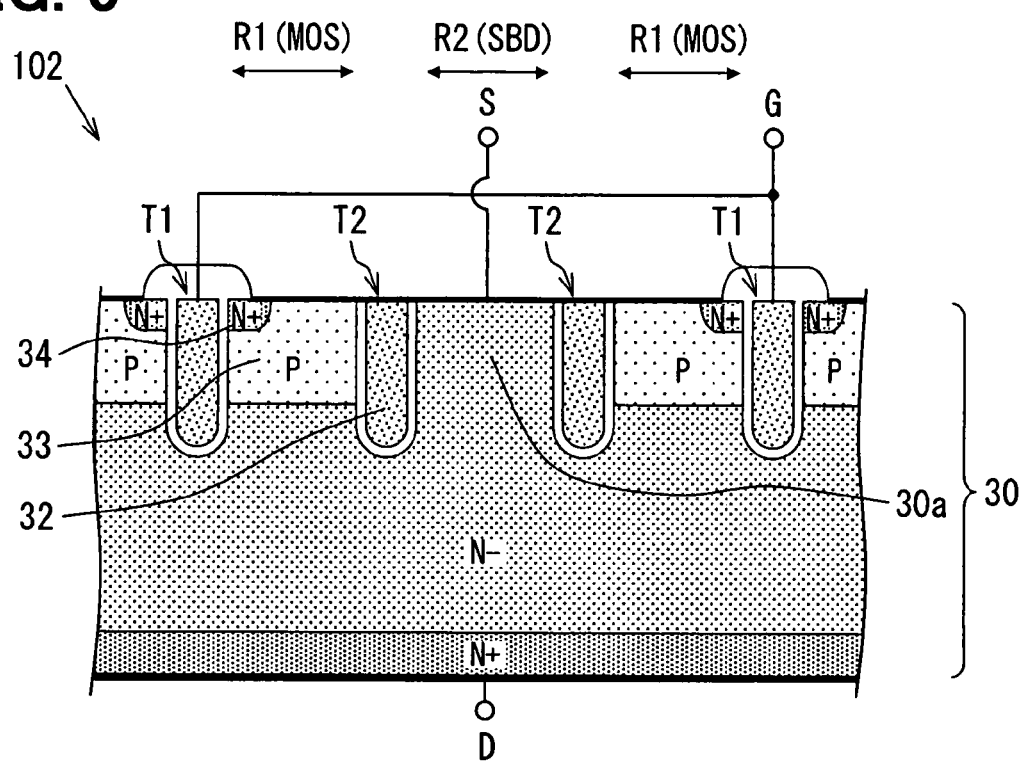
FIG. 5 shows another exemplary semiconductor device, that is, it is a schematic sectional view of a semiconductor device 102.
Figure 6:
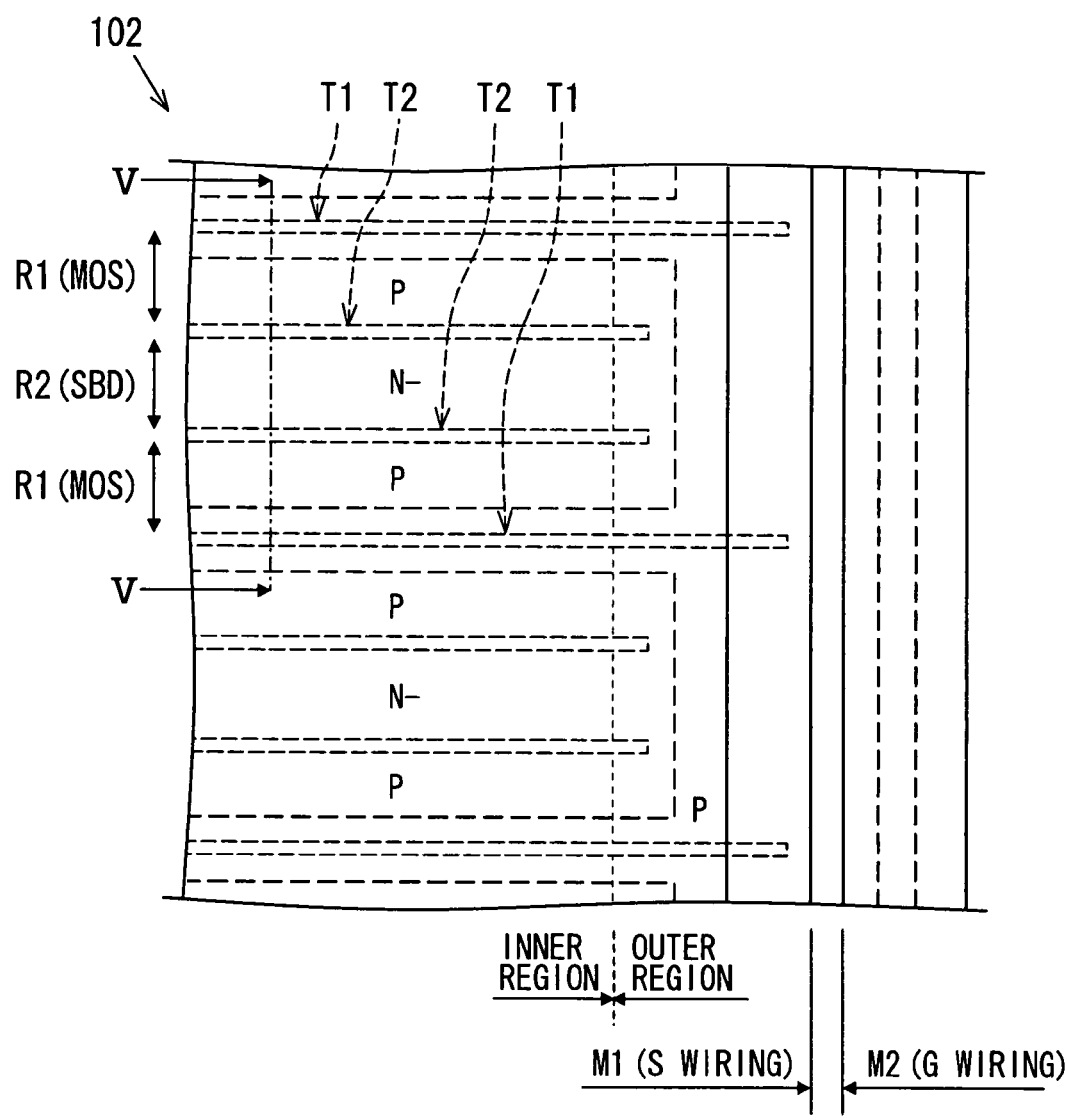
FIG. 6 is a schematic plan view showing an exemplary planar pattern of an important part of the semiconductor device 102 of FIG. 5, and a sectional view taken along a chain line V-V in FIG. 6 corresponds to FIG. 5.

FIG. 5 shows another exemplary semiconductor device, that is, it is a schematic sectional view of a semiconductor device 102. FIG. 6 is a schematic plan view showing an exemplary planar pattern of the semiconductor device 102 of FIG. 5, and a sectional view taken along a chain line C-C in FIG. 6 corresponds to FIG. 5. Portions of the semiconductor device 102 of FIGS. 5 and 6 are given the same symbols as corresponding portions of the semiconductor device 100 of FIGS. 1 and 2.

In the semiconductor device 102 of FIGS. 5 and 6, as in the semiconductor device 100 of FIGS. 1 and 2, the second buried trenches T2 are connected to the source (S) interconnection of the MOS. On the other hand, the semiconductor device 102 of FIGS. 5 and 6 is different from the semiconductor device 100 of FIGS. 1 and 2 in that, in each set of first partitioned regions R1 and a second partitioned region R2 that are adjacent to each other, the n-type (n$^+$) regions 34, the p-type layers 33, the polysilicon 32 in the second buried trenches T2, and the n-type (n$^-$) layer 30a which are exposed in the surface of the semiconductor substrate 30 are together connected to the (first) metal layer M1 as the source interconnection which is formed on the semiconductor substrate 30. Therefore, in the semiconductor device 102, forming contact portions in such a manner as to be surrounded by thick broken lines in FIG. 6 makes it unnecessary to form, as in the semiconductor device 100 (see FIG. 2), the polysilicon layers 37a which are connected directly to the polysilicon in the second buried trenches T2.

Next, a description will be made of methods for further increasing the breakdown voltage in the semiconductor devices 100-102 of FIGS. 1-6.

Figure 7:
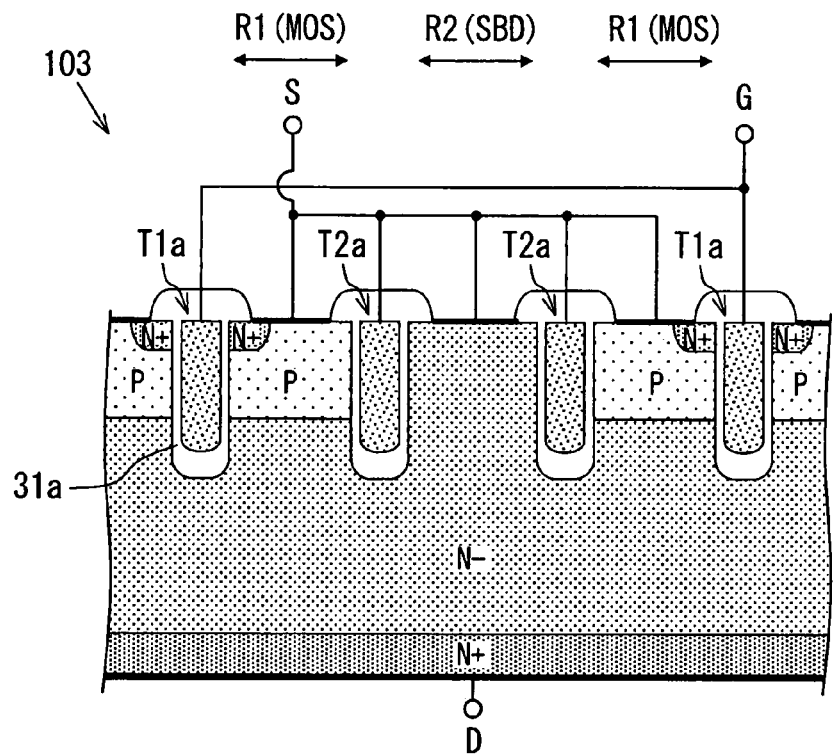
FIG. 7 shows another exemplary semiconductor device, that is, it is a schematic sectional view of a semiconductor device 103.
Figure 8:
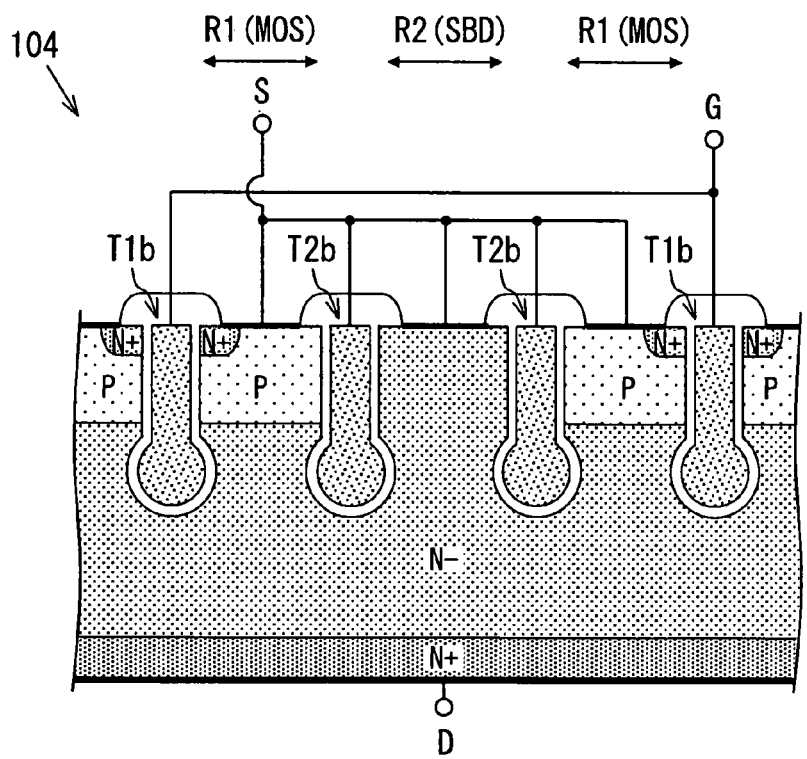
FIG. 8 shows another exemplary semiconductor device, that is, it is a schematic sectional view of a semiconductor device 104.

FIGS. 7 and 8 show other exemplary semiconductor devices, that is, they are schematic sectional views of semiconductor devices 103 and 104. Portions of the semiconductor devices 103 and 104 of FIGS. 7 and 8 are given the same symbols as corresponding portions of the semiconductor device 100 of FIG. 1.

In the semiconductor device 100 of FIG. 1, the insulating film 31 of each of the buried trenches T1 and T2 is formed at the same thickness in the trench bottom portion and the trench side wall portions. In contrast, in the semiconductor device 103 of FIG. 7, to increase the breakdown voltage, the insulating film 31a of each of buried trenches T1a and T2a is thicker in the trench bottom portion than in the trench side wall portions. For example, the structure of each of the buried trenches T1a and T2a of the semiconductor device 103 of FIG. 7 can be obtained by forming an oxide film by thermal oxidation at the same thickness in the bottom portion and the side wall portions after formation of the trench and then depositing an oxide film in the trench bottom portion.

In the semiconductor device 100 of FIG. 1, each of the buried trenches T1 and T2 is formed in such a manner that the radius of curvature of the trench bottom portion is equal to ½ of the trench width of the trench top portion. In contrast, in the semiconductor device 104 of FIG. 8, to increase the breakdown voltage, each of buried trenches T1b and T2b are formed in such a manner that the radius of curvature of the trench bottom portion is larger than ½ of the trench width of the trench top portion. For example, the structure of each of the buried trenches T1b and T2b of the semiconductor device 104 of FIG. 8 can be obtained by forming a trench by anisotropic etching and then performing isotropic etching in a state that reaction products that are stuck to the trench side walls are not removed.

The break down voltage can be increased further by decreasing the width of the second buried trenches R2 in the semiconductor devices 100-102 of FIGS. 1-6.

Figure 9:
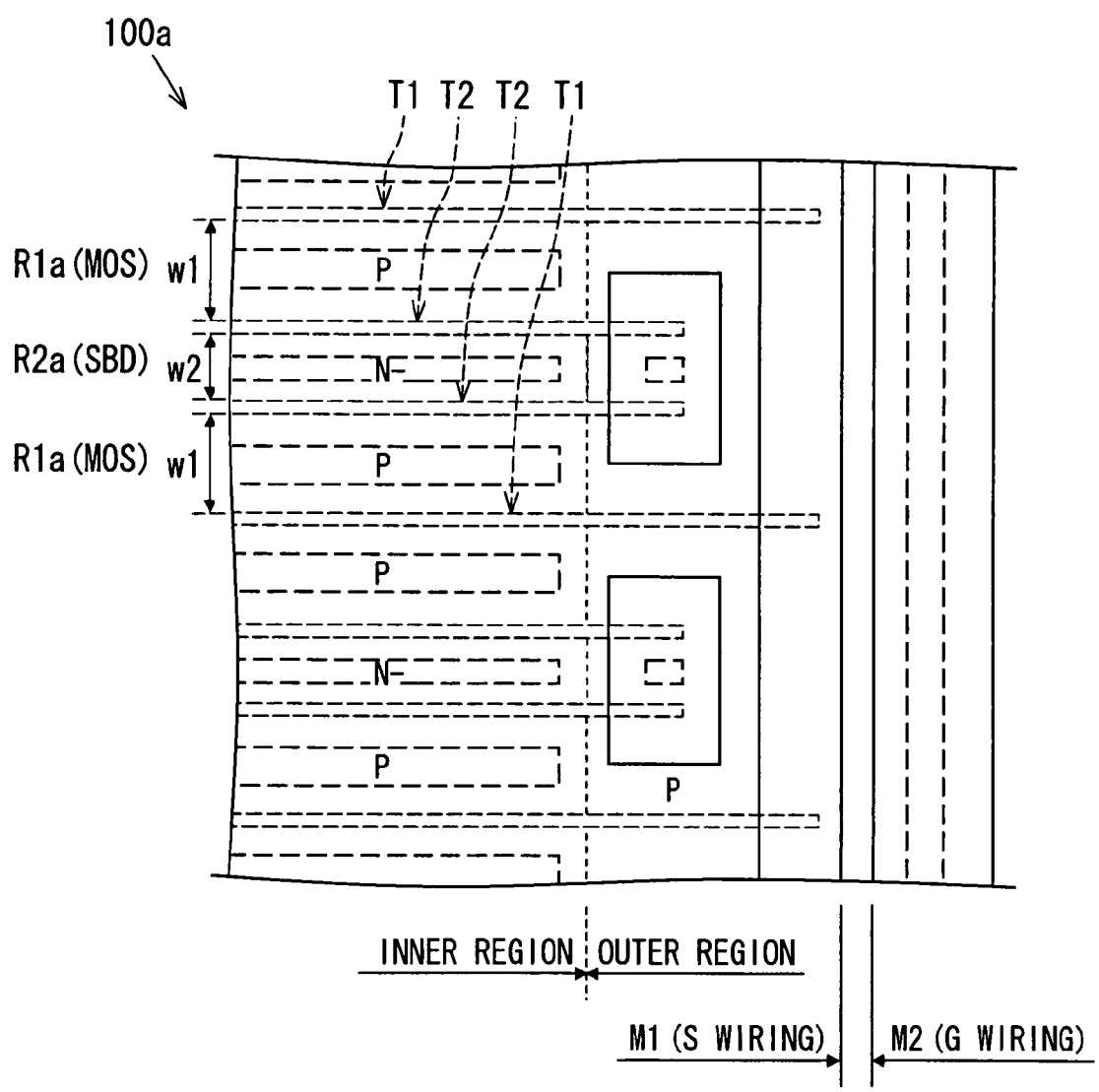
Figure 10:
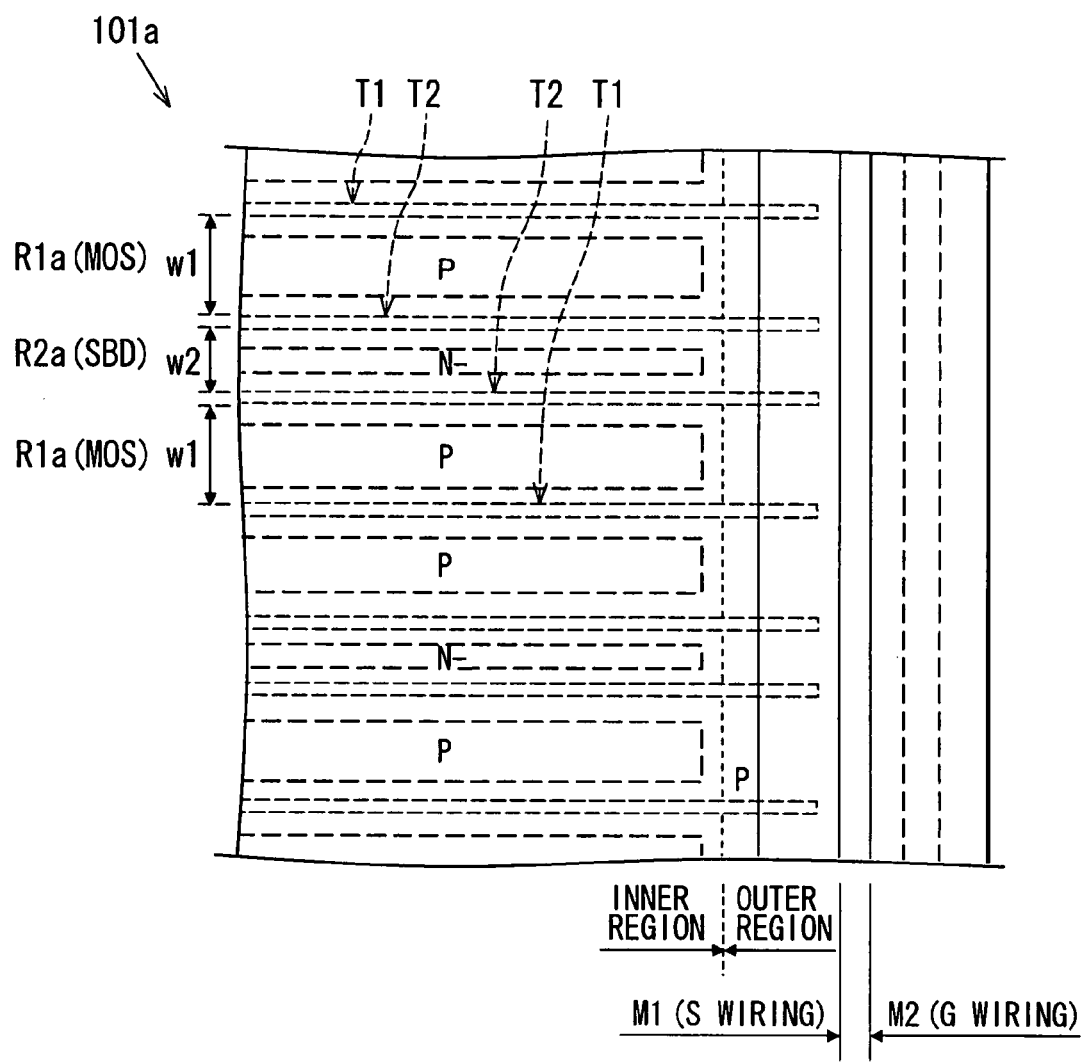
Figure 11:
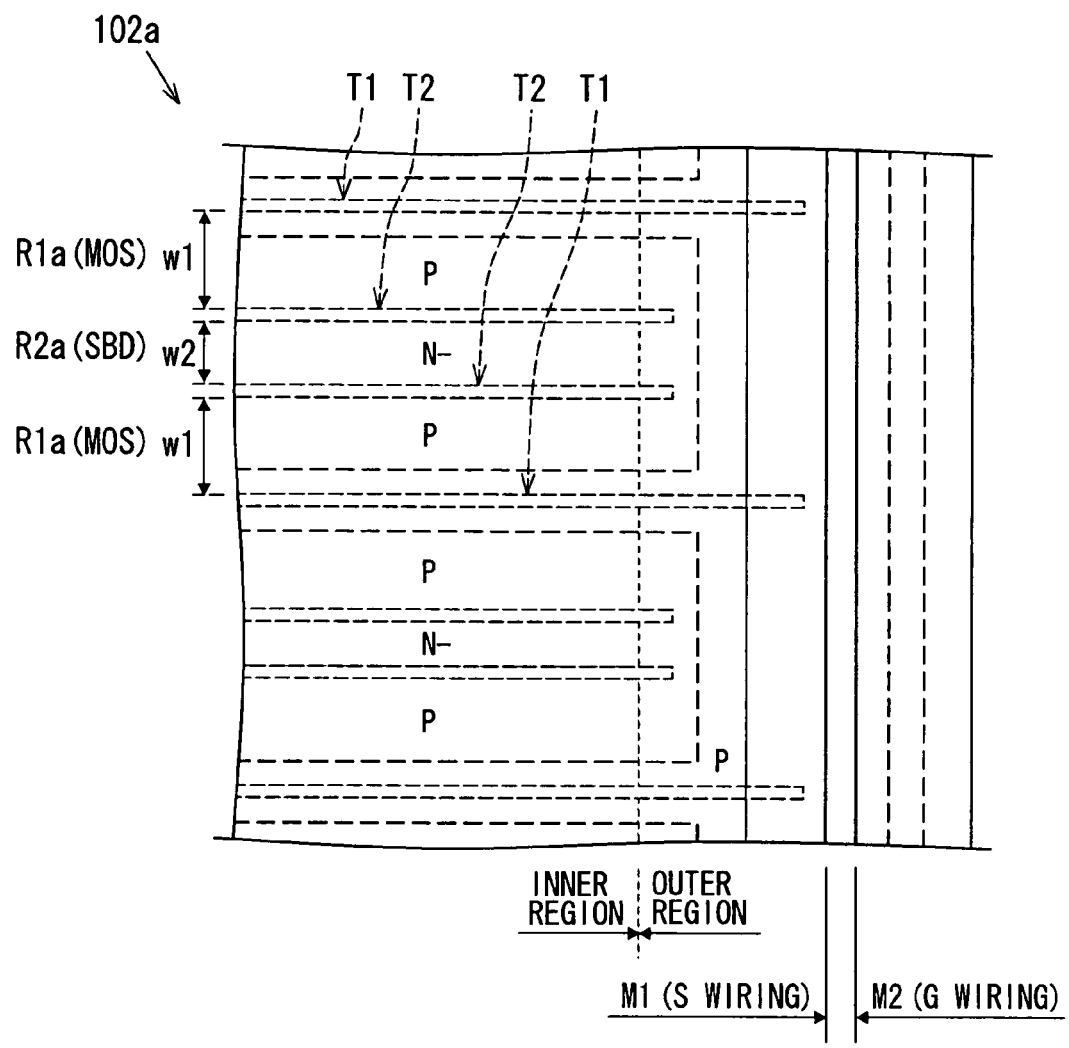

FIGS. 9-11 show other exemplary semiconductor devices, that is, they are schematic plan views showing exemplary planar patterns of important parts of semiconductor devices 100a-102a. Portions of the semiconductor devices 100a-102a of FIGS. 9-11 are given the same symbols as corresponding portions of the semiconductor devices 100-102 of FIGS. 2, 4, and 6.

As shown in FIGS. 2, 4, and 6, in the semiconductor devices 100-102, the width of the partitioned regions R1 is set approximately the same as that of the partitioned regions R2, that is, the intervals between the adjoining ones of the straight buried trenches T1 and T2 which are parallel with each other are set approximately identical. In contrast, in the semiconductor devices 100a-102a of FIGS. 9-11, the width w2 of second buried trenches R2a is set smaller than the width w1 of first buried trenches R1a. With this measure, the breakdown voltage can be made higher than in the semiconductor devices 100-102 of FIGS. 2, 4, and 6. The reduction in breakdown voltage due to the insertion of the second partitioned regions R2a (i.e., SBD), as compared with the case that the second partitioned regions R2a (i.e., SBD) are not provided, can thus be decreased.

Figure 13:
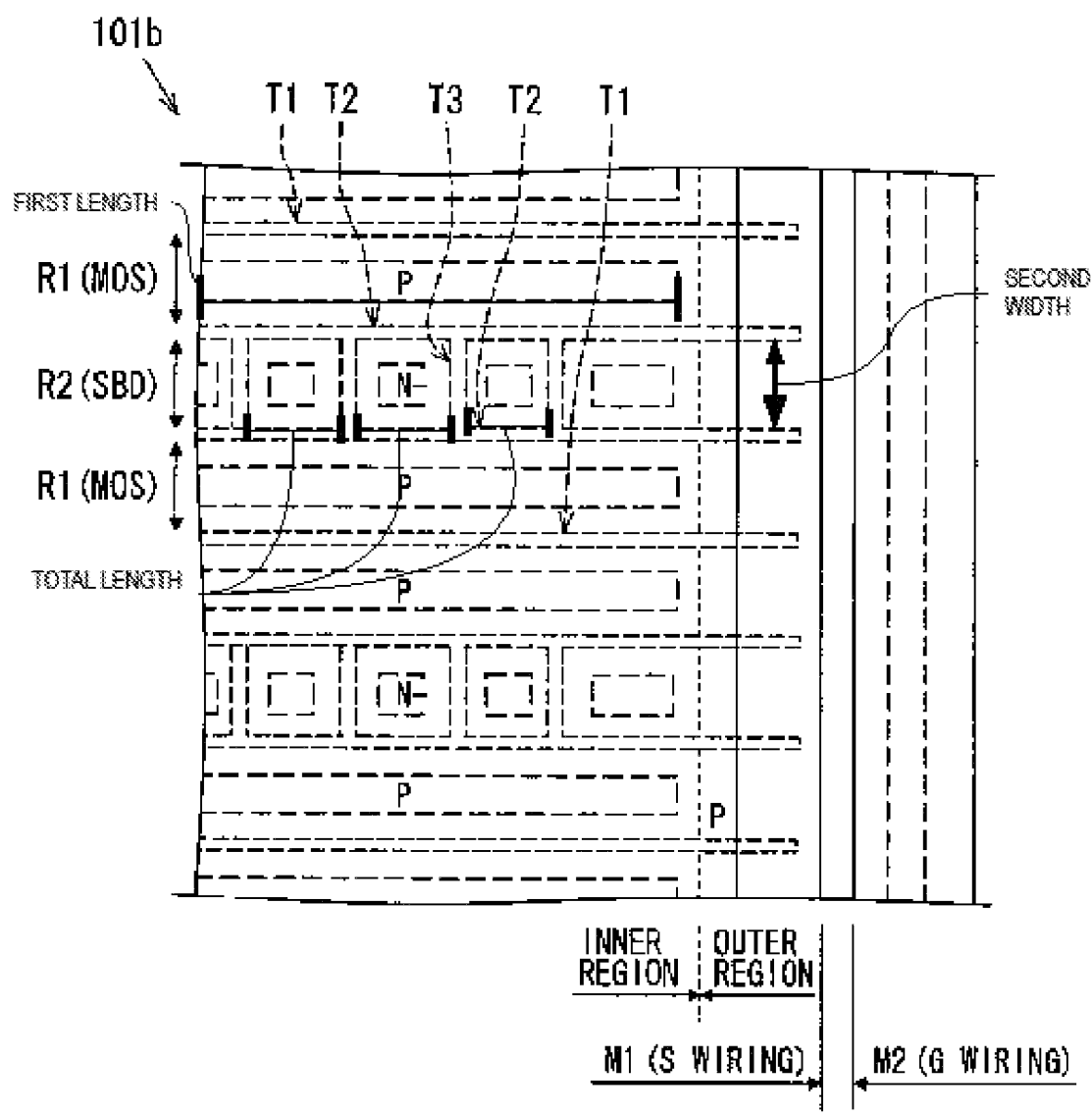
FIG. 13 shows another exemplary semiconductor device, that is, it is a schematic plan view showing an exemplary planar pattern of an important part of a semiconductor device 101b.
Figure 14:
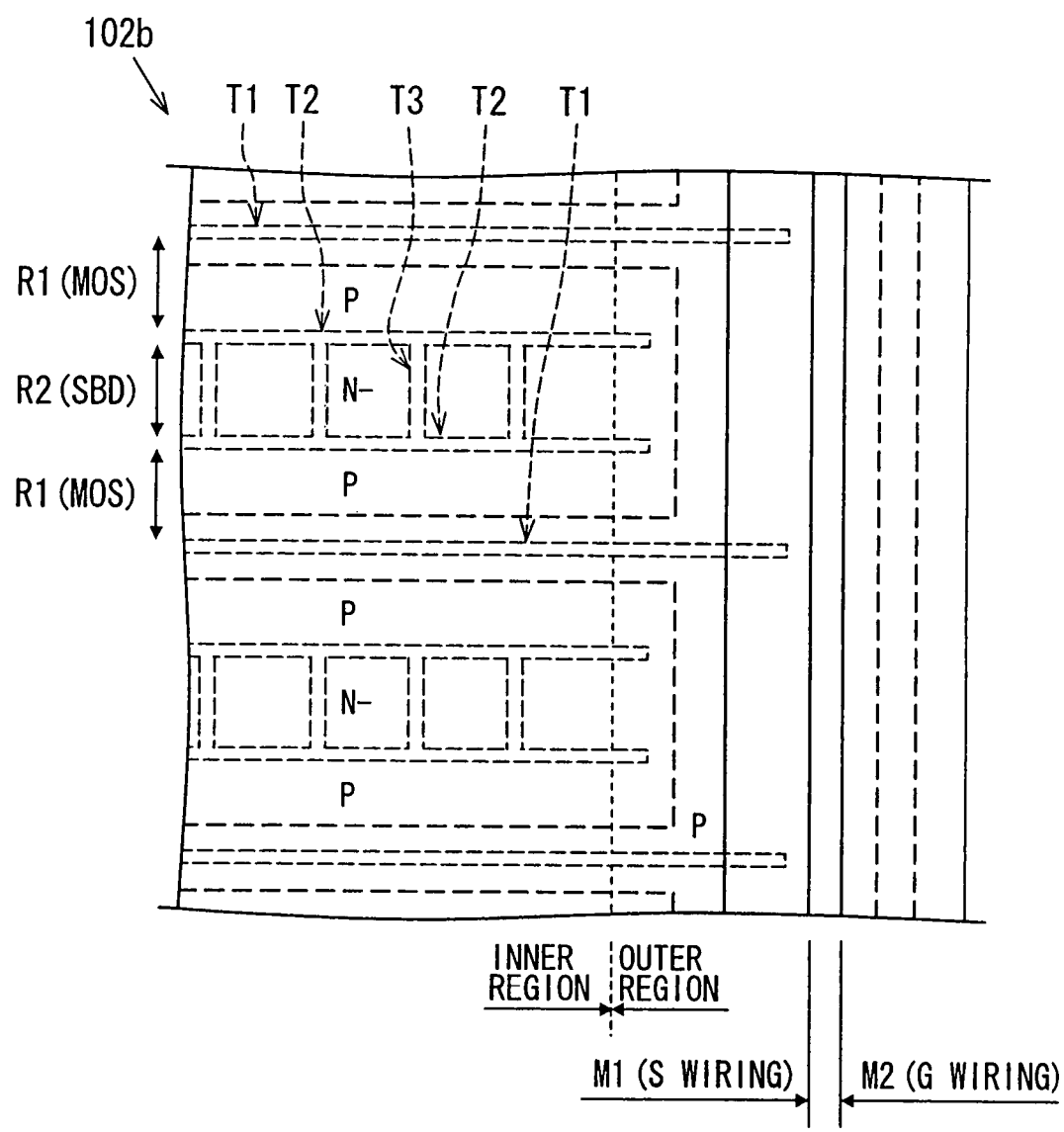
FIG. 14 shows another exemplary semiconductor device, that is, it is a schematic plan view showing an exemplary planar pattern of an important part of a semiconductor device 102b.
Figure 15:
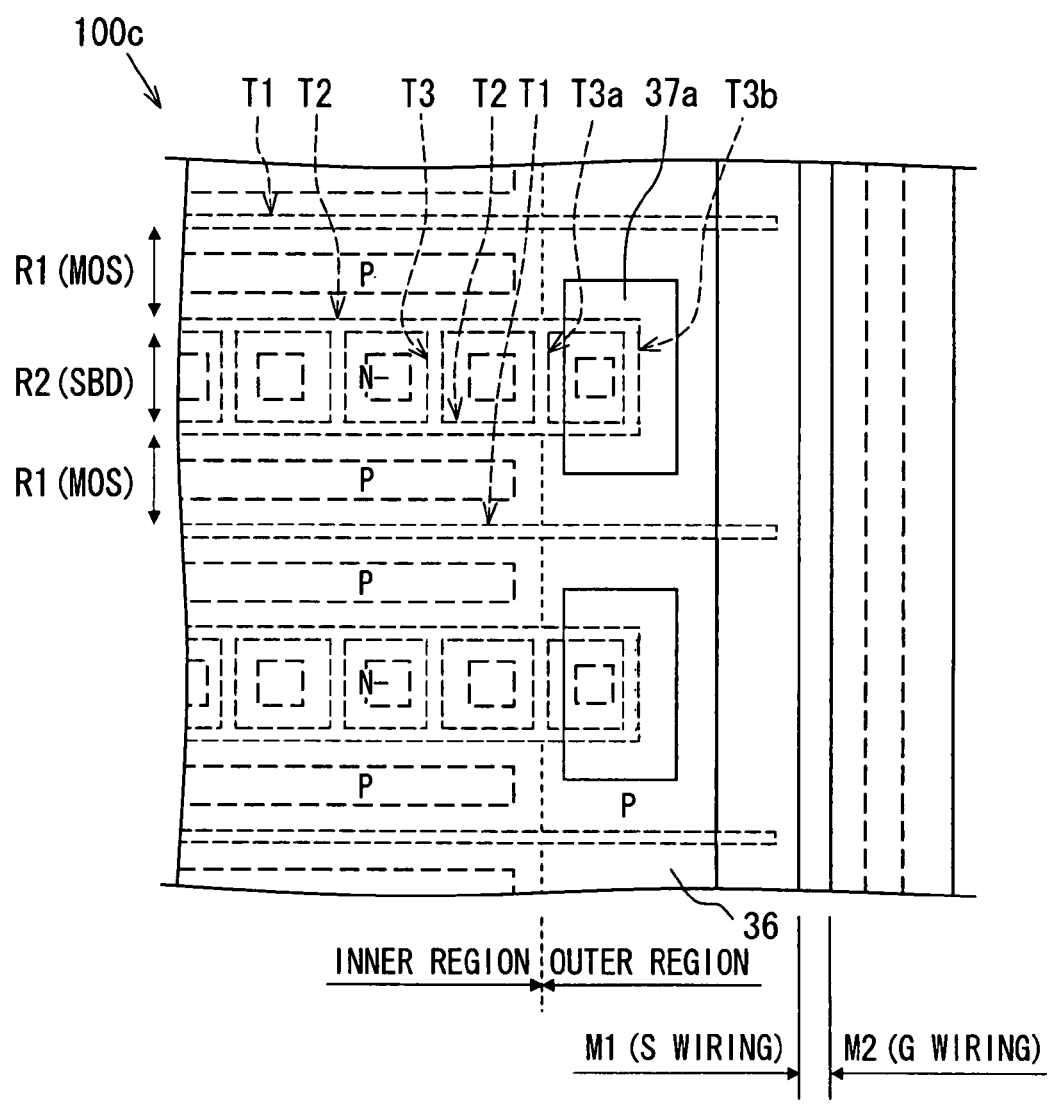
FIG. 15 shows a further exemplary semiconductor device, that is, it is a schematic plan view showing an exemplary planar pattern of an important part of a semiconductor device 100c.
Figure 16:
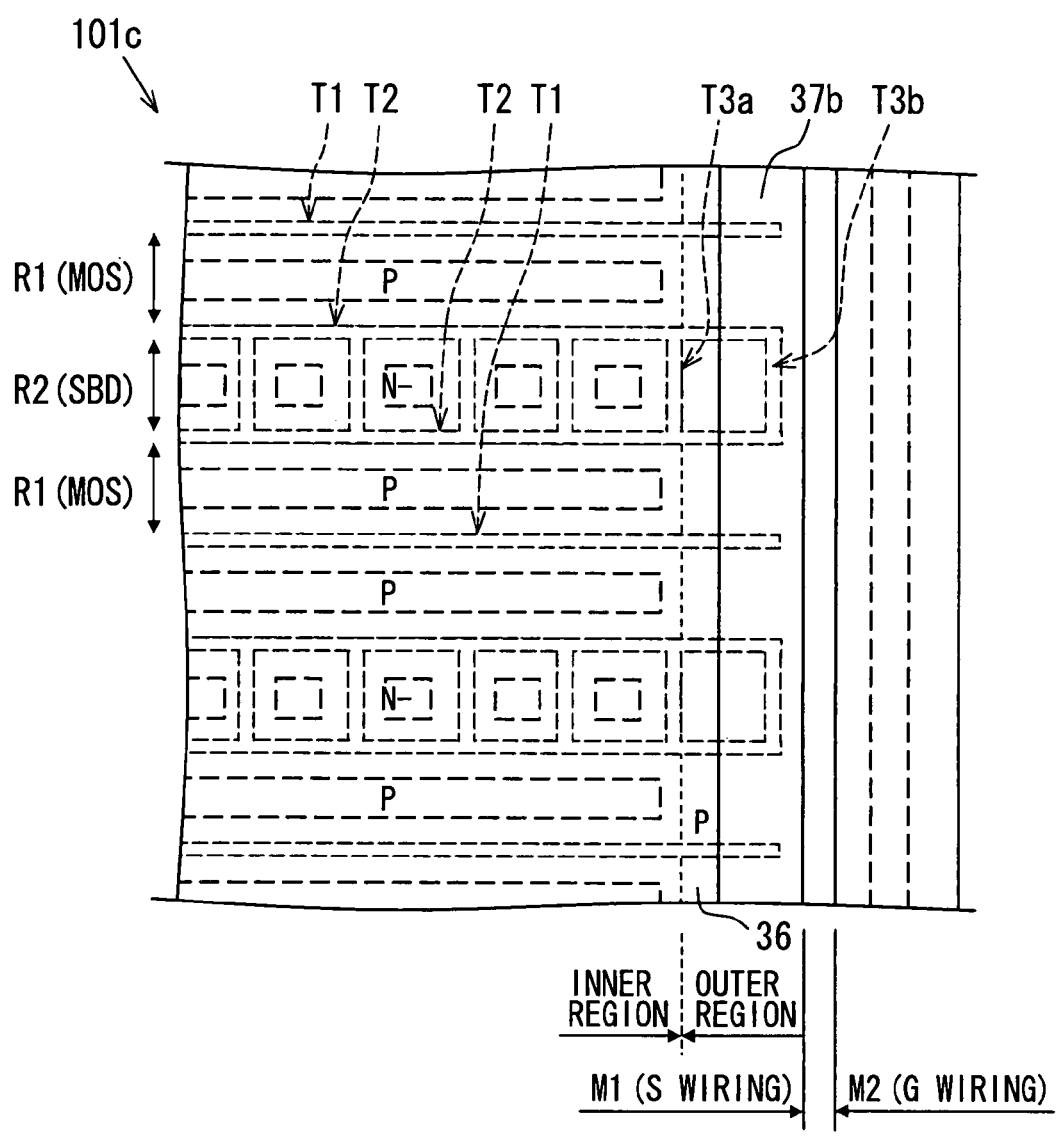
FIG. 16 shows another exemplary semiconductor device, that is, it is a schematic plan view showing an exemplary planar pattern of an important part of a semiconductor device 101c.
Figure 17:
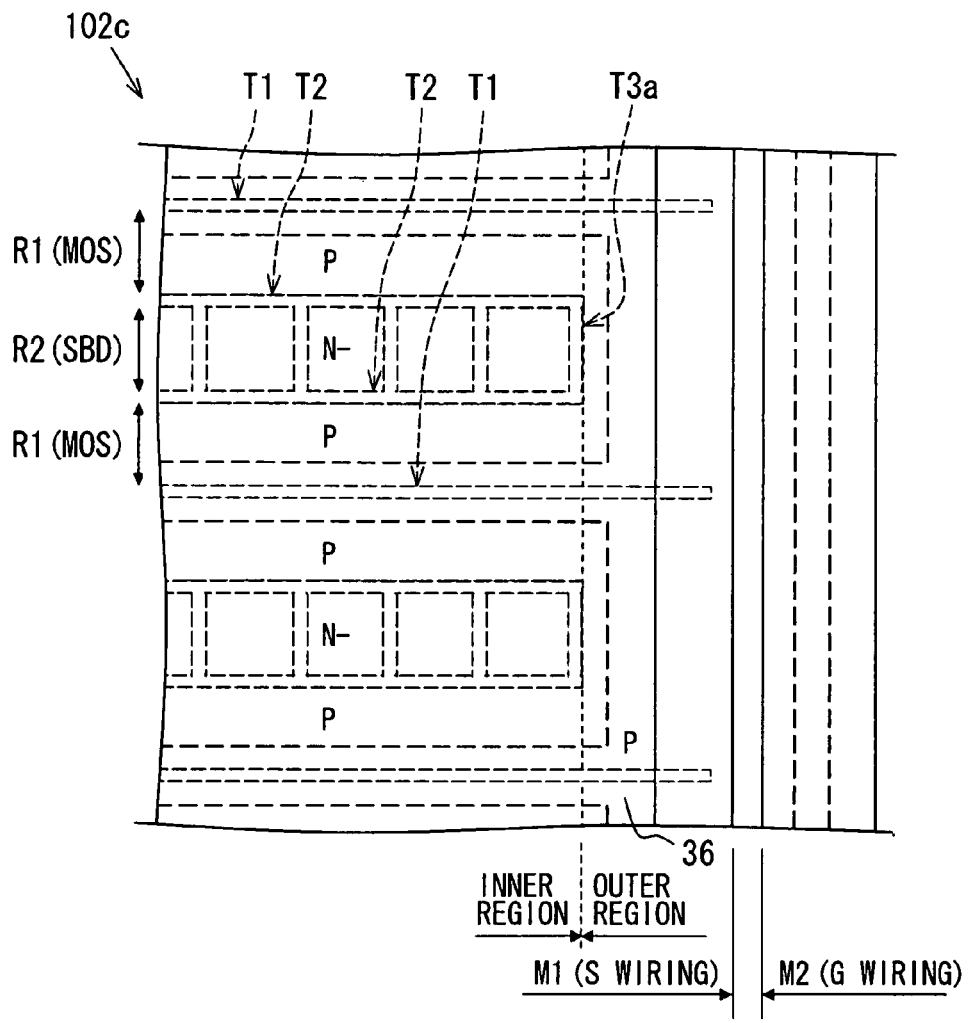
FIG. 17 shows another exemplary semiconductor device, that is, it is a schematic plan view showing an exemplary planar pattern of an important part of a semiconductor device 102c.

FIGS. 12-14 and FIGS. 15-17 show other exemplary semiconductor devices, that is, they are schematic plan views showing exemplary planar patterns of important parts of semiconductor devices 100b-102b and 100c-102c, respectively. Portions of the semiconductor devices 100b-102b of FIGS. 12-14 and portions of the semiconductor devices 100c-102c of FIGS. 15-17 are given the same symbols as corresponding portions of the semiconductor devices 100-102 of FIGS. 2, 4, and 6.

Figure 12:
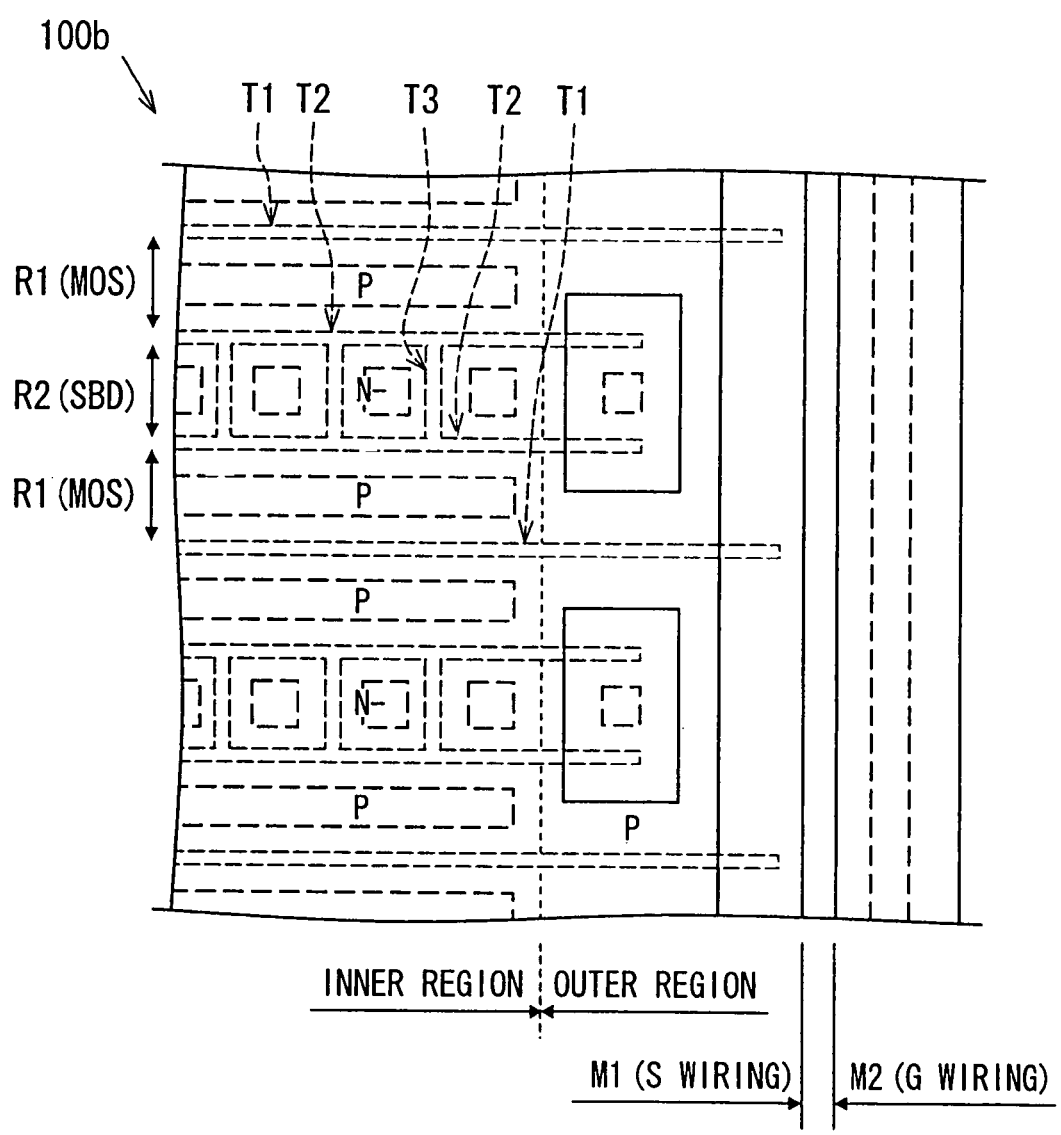
FIG. 12 shows yet another exemplary semiconductor device, that is, it is a schematic plan view showing an exemplary planar pattern of an important part of a semiconductor device 100b.

The semiconductor devices 100b-102b of FIGS. 12-14 are different from the semiconductor devices 100-102 of FIGS. 2, 4, and 6, respectively, in that plural third buried trenches T3 are formed so as to bridge, in a ladder-like manner, the two adjoining buried trenches T2 that define each second partitioned region R2. Each second partitioned region R2 is partitioned into plural small regions by the plural third buried trenches T3, which makes it possible to decrease the reduction in breakdown voltage due to the insertion of the second partitioned regions R2 (i.e., SBD). To decrease the reduction in breakdown voltage, it is preferable that the plural small regions be approximately square as shown in FIGS. 12-14.

In addition to decreasing the reduction in breakdown voltage, the third buried trenches T3 can be used for preventing lateral diffusion toward the second partitioned regions R2 in forming the outer p-type region 36 as well as for increasing the contact areas of the polysilicon in the buried trenches T2 and the polysilicon layers 37a or the polysilicon layer 37b which are or is formed on the substrate. In the semiconductor devices 100c-102c of FIGS. 15-17, third buried trenches T3a that are formed at the ends of the respective second partitioned regions R2 are used for preventing lateral diffusion toward the second partitioned region R2 in forming the outside p-type region 36. In the semiconductor devices 100c and 101c of FIGS. 15 and 16, third buried trenches T3b that are located right under the respective polysilicon layers 37a or the polysilicon layer 37b are used for increasing the contact areas of the polysilicon in the buried trenches T2 and the polysilicon layers 37a or the polysilicon layer 37b which are or is formed on the substrate.

In the semiconductor devices 100-104, 100a-102a, 100b-102b, and 100c-102c of FIGS. 1-17, the n-type (n⁻) semiconductor substrate 30 is used and the p-type layers (P) 33 to serve as the channel forming regions of the MOS and the portions of the n-type layer 30a to form the Schottky barriers of the SBD are formed in main-surface-side surface portions. For the MOS as the component of each of the semiconductor devices 100-104, 100a-102a, 100b-102b, and 100c-102c to exhibit good characteristics, it is preferable to employ the conductivity types of the individual portions of the semiconductor devices 100-102 of FIGS. 1, 3, 5. Alternatively, semiconductor devices are possible in which the conductivity types of all the individual portions are reversed from those of the semiconductor devices 100-104, 100a-102a, 100b-102b, and 100c-102c.

As described tin the above examples, the semiconductor device is a semiconductor device in which a vertical MOS transistor having a trench gate structure and a Schottky barrier diode are formed adjacent to each other on a single semiconductor substrate, and which is superior in the diode recovery characteristic and can lower the forward loss, is free of reduction in transistor breakdown voltage and surge resistance, is superior in the switching characteristic, and is small in size and inexpensive.

As such, the semiconductor device can be used suitably as a semiconductor device which is an inverter circuit that is a combination of a vertical MOS transistor and a free-wheel diode (FWD). In this case, the Schottky barrier diode serves as the FWD.

Being small in size and capable of securing a high breakdown voltage, the semiconductor device is suitably used as a vehicular semiconductor device.

Second Embodiment

Figure 19:
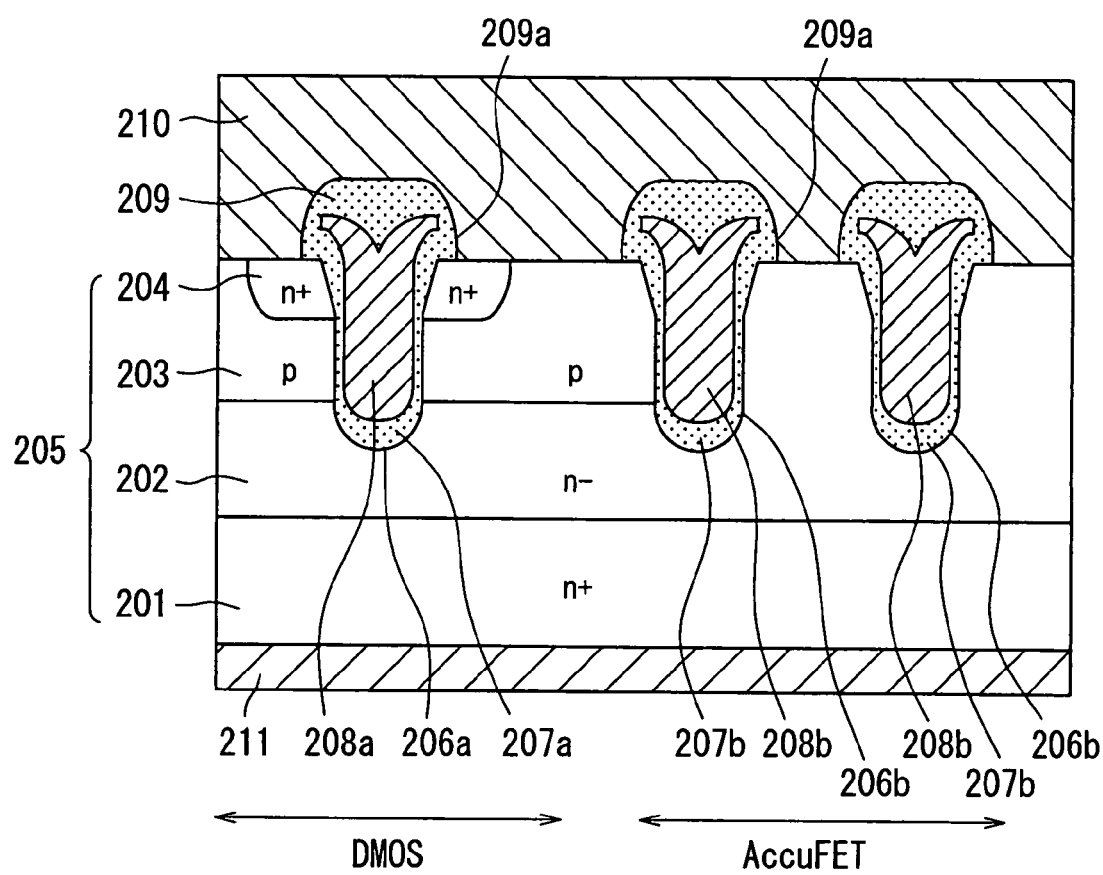
FIG. 19 shows a sectional structure of a semiconductor device according to a second embodiment which is equipped with a DMOS having a trench gate structure.
Figure 20A:
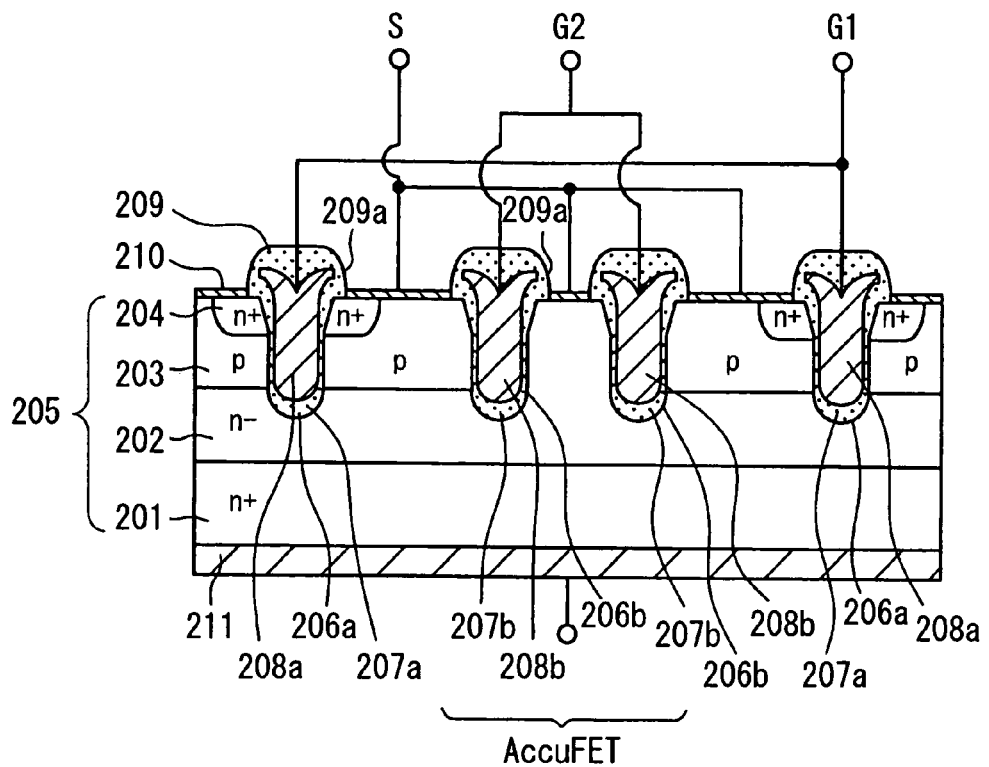
FIG. 20A is a schematic sectional view showing a wiring form of the semiconductor device of FIG. 19.
Figure 20B:
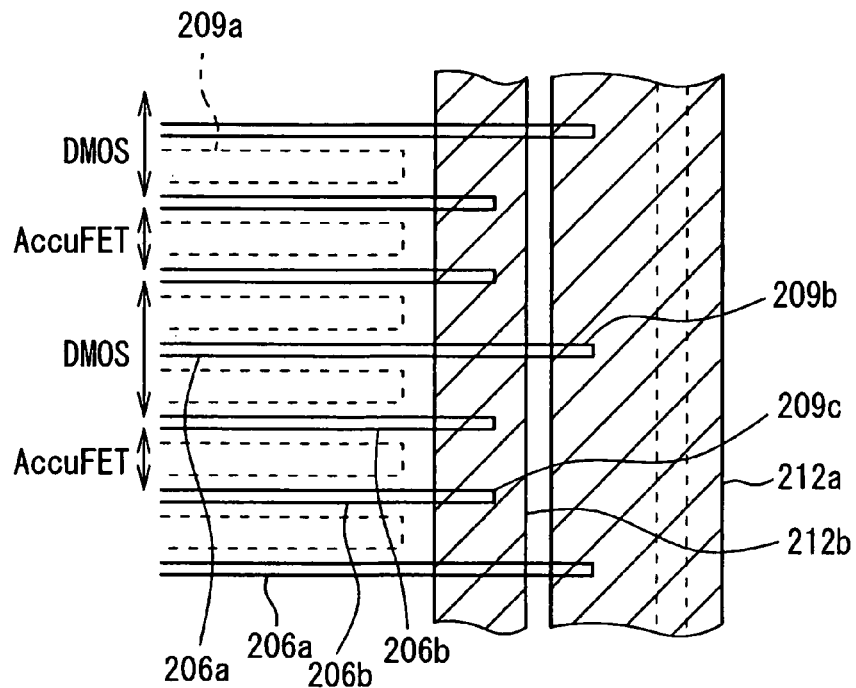
FIG. 20B shows its exemplary planar pattern.

A second embodiment will be hereinafter described. FIG. 19 shows a sectional structure of a semiconductor device according to this embodiment which is equipped with a DMOS having a trench gate structure. FIG. 20A is a schematic sectional view showing a wiring form of the semiconductor device of FIG. 19, and FIG. 20B shows its exemplary planar pattern. The configuration of the semiconductor device according to the embodiment will be described below with reference to FIG. 19 and FIGS. 20A and 20B.

The semiconductor device according to the embodiment is configured in such a manner that a DMOS having a trench gate structure and an AccuFET are formed adjacent to each other in a single chip. The AccuFET is a field-effect transistor which operates in an accumulation mode, that is, a MOSFET which is used for controlling a current flowing between trench by adjusting the widths of depletion layers formed between the trenches (refer to U.S. Pat. No. 4,903,189, for example).

As shown in FIG. 19, an n⁻ drift layer 202 is formed on an n⁺ silicon substrate 201. P-type base layers 203 are formed in portions of the drift layer 202 from its surface to a prescribed position in the depth direction in regions where a DMOS is formed (hereinafter referred to as "DMOS forming regions"). In the DMOS forming regions, plural n⁺ source regions 204 are formed in surface portions of the base layer 203 so as to be separated from the drift layer 202 by the base layer 203. The silicon substrate 201, the drift layer 202, the base layer 203, and the source regions 204 constitute the semiconductor substrate 205.

In each DMOS forming region of the semiconductor substrate 205, a first trench 206a is formed so as to penetrate through the source regions 204 and the base layer 203 and reach the drift layer 202. In the region where the AccuFET is formed (hereinafter referred to as "AccuFET forming region"), second trenches 206b are formed at the same depth and width as the first trenches 206a formed in the DMOS forming regions. Each side wall of the first trench 206a in each DMOS forming region consists of walls of the base layer 203 and a source region 204. On the other hand, one or both of the side walls of each second trench 6b in the AccuFET forming region are walls of only the drift layer 202 rather than walls of the base layer 203 and a source region 204.

A silicon oxide film (gate insulating film) 207a or 207b is formed in each of the first and second trenches 206a and 206b. Each silicon oxide film 207a or 207b is formed so as to cover the inner wall surfaces of the first trench 206a or the second trench 206b and to be in contact with the portion(s), located between the source region 204 and the drift layer 202, of the base layer 203. A gate electrode 208a or 208b is formed on the surface of each silicon oxide film 207a or 207b so as to be buried in the first trench 206a or the second trench 206b. The trench gates are thus formed.

A BPSG film 209 is formed so as to cover the gate electrodes 208a and 208b. A source electrode 210 is formed so as to be electrically connected to the source regions 204 and the base layers 203 in the DMOS forming regions and the portion of the drift layer 202 in the AccuFET region through contact holes 209a that are formed through the BPSG film 209. A drain electrode 211 is formed on the back-surface side of the semiconductor substrate 205.

In the semiconductor device having the above sectional structure, as shown in FIG. 20A, the gate electrodes 208a and the gate electrodes 208b are electrically connected to different gate interconnections 212a and 212b in cross sections that are different from FIG. 19. More specifically, as shown in FIG. 20B, the first trenches 206a and the second trenches 206b extend in the same direction in the form of stripes. One (in this embodiment, the first trenches 206a) of the first trenches 206a and the second trenches 206b project from the tips of the other (in this example, the second trenches 206b), and the gate electrodes 208a and the gate electrodes 208b are electrically connected to the different gate interconnections 212a and 212b via gate contact holes 9b and gate contact holes 209c that are formed through the BPSG film 209, respectively. To facilitate understanding of the layout of the gate interconnections 212a and 212b, the gate interconnections 212a and 212b are hatched in FIG. 20B though it is not a sectional view.

The semiconductor device according to the embodiment which is equipped with the DMOS having the trench gate structure and the AccuFET are constructed in the above-described manner. The structure can thus be obtained in which no body diode is formed in the region other than the DMOS forming regions, that is, in the AccuFET forming region.

Figure 21A:
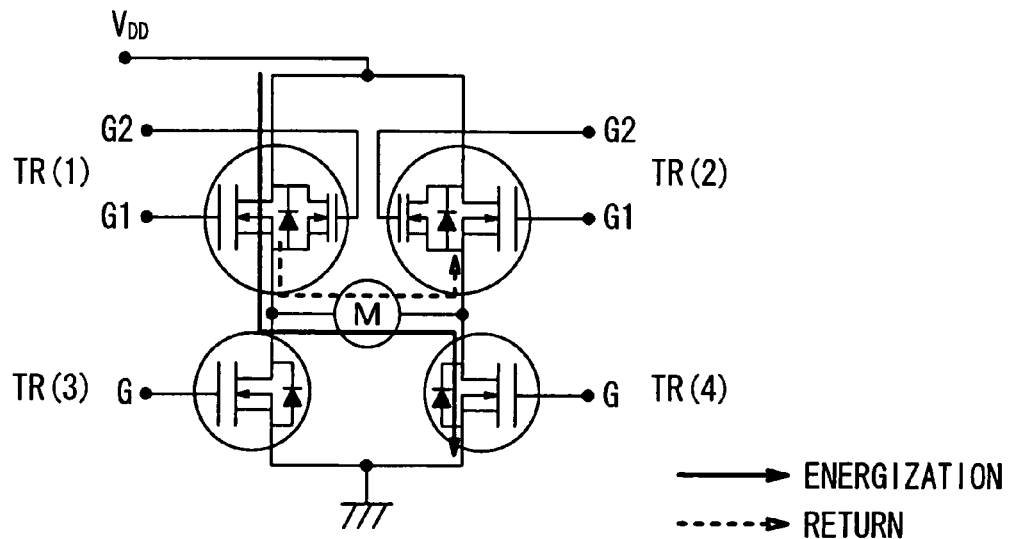
FIG. 21A is a circuit diagram in which the above-configured semiconductor devices each having the DMOS and an AccuFET are provided on the high side of an H-bridge circuit for motor driving.
Figure 21B:
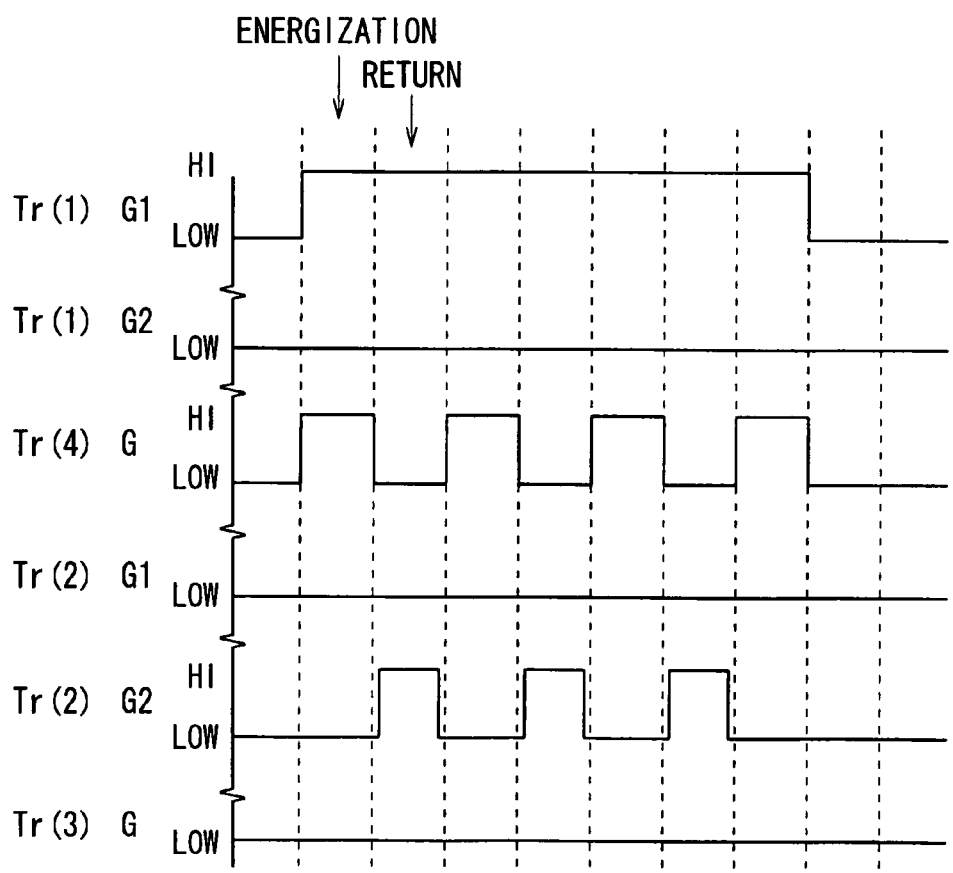
FIG. 21 B is a timing chart showing voltages applied to the gate electrodes of the semiconductor devices located on the high side and voltages applied to the gate electrodes of DMOSs that are located on the low side when motor driving is performed by a PWM-control by means of the H-bridge circuit.

Next, a description will be made of the operation of the above-configured semiconductor device which is equipped with the DMOS having the trench gate structure and the AccuFET. FIG. 21A is a circuit diagram in which the above-configured semiconductor devices TR(1) and TR(2) each having the DMOS and the AccuFET are provided on the high side of an H-bridge circuit for motor driving. FIG. 21B is a timing chart showing voltages applied to the gate electrodes 8a and 8b and voltages applied to the gate electrodes of DMOSs that are located on the low side when motor driving is performed by a PWM-control by means of the H-bridge circuit. In FIGS. 21A and 21B, symbols G1 and G2 denote the gate electrodes 8a of the DMOS and the gate electrodes 208b of the AccuFETs, respectively, of each of the high-side semiconductor devices TR(1) and TR(2). Symbol G denotes the gate electrodes of each of low-side semiconductor devices TR(3) and TR(4). The waveforms correspond to a case that the AccuFETs are of a normally-off type. Although the gate electrodes 208a of the semiconductor device TR(2) are kept at the low level, they may be supplied with the same waveform as the gate electrodes 208b are supplied.

Figure 22A:
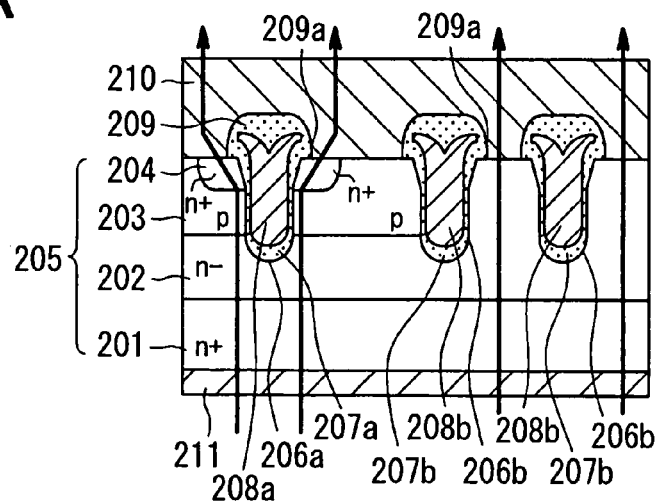
FIGS. 22A to 22C are schematic diagrams showing current paths of a case that the semiconductor devices of FIG. 19 are provided on the high side of the H-bridge circuit and the DMOSs are on/off-controlled by a PWM control.
Figure 22B:
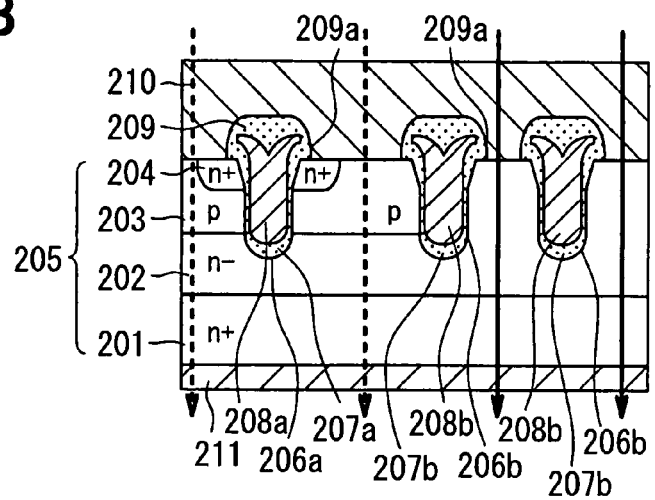
Figure 22C:
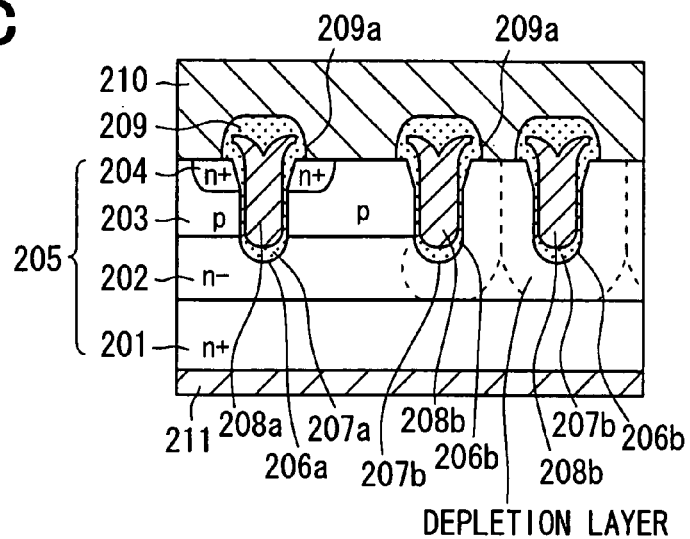

FIGS. 22A to 22C are schematic diagrams showing current paths of a case that the semiconductor devices of FIG. 19 are arranged as shown in FIG. 21A and the DMOSs are on/off-controlled by a PWM control. FIG. 22A shows energization current paths of the DMOS of the semiconductor devices TR(1) or TR(2), FIG. 22B shows return current paths of the DMOS of the semiconductor devices TR(1) or TR(2), and FIG. 22C shows current paths when the DMOS is off.

Assume a case that the semiconductor devices according to the embodiment are provided on the high side of the H-bridge circuit as shown in FIG. 21A and that an energization current flow as indicated by arrows in FIG. 22A and a return current flow as indicated by broken-line arrows in FIG. 22B. Energization is started by switching the voltage applied to the gate electrodes 208a of the DMOS of the semiconductor device TR(1) (shown at the top-left position in FIG. 21A) from low to high as shown in FIG. 21B. At this time, the voltage of the gate electrodes 208b of the AccuFET of the TR(1) is set at the low level. The gate voltage of the low-side semiconductor device TR(4) which is diagonally opposite to the semiconductor device TR(1) is switched repeatedly between the high level and the low level. The voltage applied to the gate electrodes 208b of the AccuFET of the other high-side semiconductor device TR(2) is switched repeatedly between the low level and the high level in a phase that is approximately opposite to the phase of the gate voltage applied to the low-side semiconductor device TR(4) though dead times exist. A return period starts when the gate voltage applied to the DMOS of the semiconductor device TR(4) is switched from high to low. The operations shown in FIGS. 22A and 22B are performed in the energization period and the return period, respectively.

First, as shown in FIG. 22A, during the energization period, a voltage is applied to the gate electrodes 208a of the semiconductor device TR(1), whereby channels are formed in the base layers 203 that are in contact with the silicon oxide films 207a and hence the DMOS is turned on. While this DMOS is on, a current flows from the drain electrode 211 to the source electrode 210 as indicated by arrows in FIG. 22A. During the return period when the DMOS of the semiconductor device TR(4) is switched from on to off, as shown in FIG. 22B a current flows in the direction opposite to the direction in the energization period, that is, from the source electrode 210 to the drain electrode 211. At this time, since the AccuFET is provided in addition to the DMOS and the voltage applied to the gate electrodes 208b of the AccuFET of the semiconductor device TR(2) is switched from low to high, a return current flows through the AccuFET but almost no return current flows through the DMOS. As a result, the loss that is mainly due to Vf of the body diodes can be reduced.

When the flow of the return current is finished after the DMOS of the semiconductor device TR(4) was switched from on to off, as shown in FIG. 22C the portion of the drift layer 202 between the second trenches 206b of the AccuFET is pinched off by depletion layers extending from the second trenches 206b into the drift layer 202 and the current path leading to the drift layer 202 is interrupted. In this manner, current flow can be prevented while the DMOS and the AccuFET are off. Current leakage can thus be prevented while the AccuFET is off.

As described above, the semiconductor device according to the embodiment is configured in such a manner that not only the DMOS but also the AccuFET is formed in the single chip. Therefore, a return current is allowed to flow through the AccuFET rather than the DMOS, which provides the advantage that the loss that is mainly due to Vf of the body diodes can be reduced.

Next, a manufacturing method of the above-configured semiconductor device will be described with reference to sectional views of FIGS. 23A to 23G showing a manufacturing process of the semiconductor device according to the embodiment.

Figure 23A:
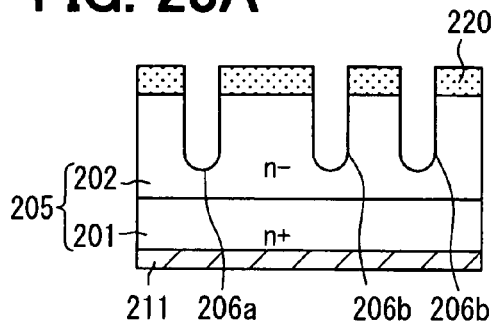
FIGS. 23A to 23G are sectional views showing a manufacturing process of the semiconductor device of FIG. 19.

First, in a step of FIG. 23A, an n$^+$ silicon substrate 201 is prepared and an n$^-$ drift layer 202 is formed on the silicon substrate 201 by epitaxial growth. Then, a silicon oxide film 220 to become a first mask is deposited by CVD and then patterned by photolithography and dry etching, whereby openings are formed through the silicon oxide film 220. Then, first and second trenches 206a and 206b are formed in the DMOS forming regions and the AccuFET forming region by anisotropic dry etching with the thus-patterned silicon oxide film 220 used as a mask.

Figure 23B:
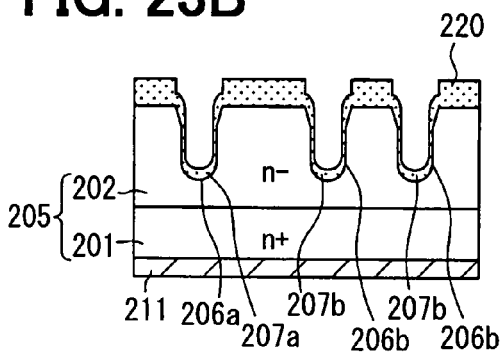

In a step of FIG. 23B, the silicon that forms the first and second trenches 206a and 206b is etched isotropically by about 0.1 μm by chemical dry etching using a $CF_4$ or $O_2$ gas. Then, pseudo-oxide films are formed by thermal oxidation in an $H_2O$ or $O_2$ atmosphere. The pseudo-oxide films are thereafter removed by wet etching using diluted hydrofluoric acid, whereby etching damage is eliminated and the corner portions of the first and second trenches 206a and 206b are rounded. Then, thermal oxidation is performed again in an $H_2O$ or $O_2$ atmosphere, whereby silicon oxide films 207a and 207b are formed.

Figure 23C:
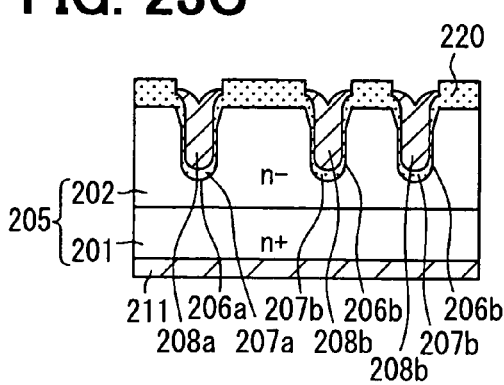

In a step of FIG. 23C, doped polysilicon films for formation of gate electrodes 8a and 208b are formed by LPCVD and then etched back so as to have a desired thickness. Naturally, instead of forming doped polysilicon films, an impurity may be introduced after depositing non-doped polysilicon films. Subsequently, the doped polysilicon films are patterned into gate electrodes 208a and 208b. Trench gates are thus completed.

Figure 23D:
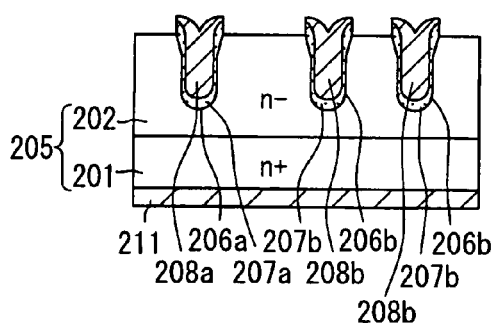

In a step of FIG. 23D, the silicon oxide film 220 as the first mask is removed. As a result, the drift layer 202 is exposed except in the trench gates.

Figure 23E:
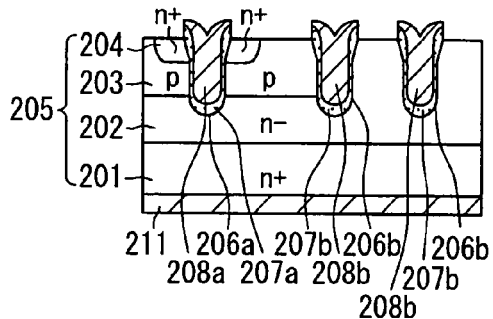
Figure 23F:
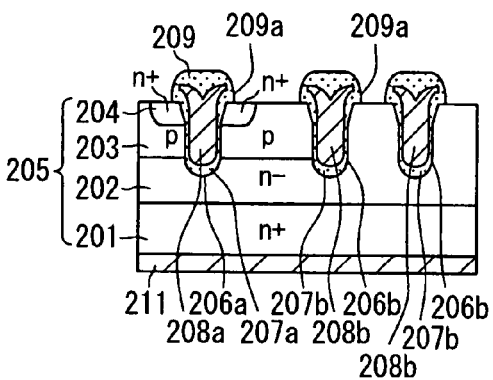

In a step of FIG. 23E, after an ion implantation mask etc. are formed if necessary, the regions other than the regions where base layers 203 will be formed are covered with a second mask. In this state, p-type impurity ions are implanted, whereby base layers 203 are formed in the DMOS forming regions. Then, after the second mask is removed, the regions other than the regions where source regions 204 will be formed are covered with a third mask. In this state, n-type impurity ions are implanted, whereby source regions 204 are formed in the DMOS forming regions.

Figure 23G:
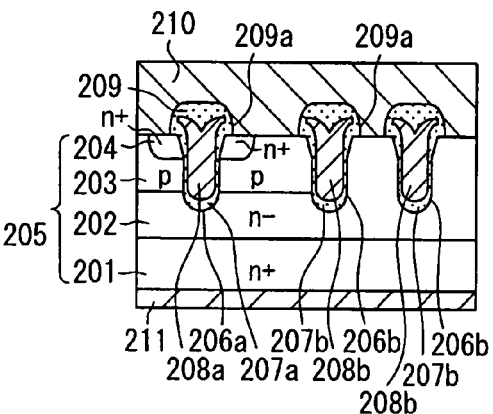

In a step of FIG. 23G, a BPSG film 209 is formed as an interlayer insulating film on the entire surface of the semiconductor substrate 205 and then etching is performed by using a fourth mask (not shown), whereby contact holes 209a are formed through the BPSG film 209 (contact holes 209b and 209c (not shown) are also formed at the same time). The fourth mask is removed thereafter.

In a step of FIG. 23G, a metal film is formed on the BPSG film 9 and patterned, whereby a source electrode 210 is formed which is connected to the source regions 204 and the base layers 203 in the DMOS regions and is connected to the drift layer 202 in the AccuFET region and gate interconnections that are electrically connected to the gate electrodes 208a and the gate electrodes 208b in cross sections that are different from FIG. 23G are formed.

In subsequent manufacturing steps which are not shown in any drawings, the thickness of the silicon substrate 201 is reduced by grinding its back surface and a metal layer as a drain electrode 211 is formed on the back surface. The semiconductor device of FIG. 19 in which the DMOS having the trench gate structure and the AccuFET are formed is completed.

Third Embodiment

Figure 24:
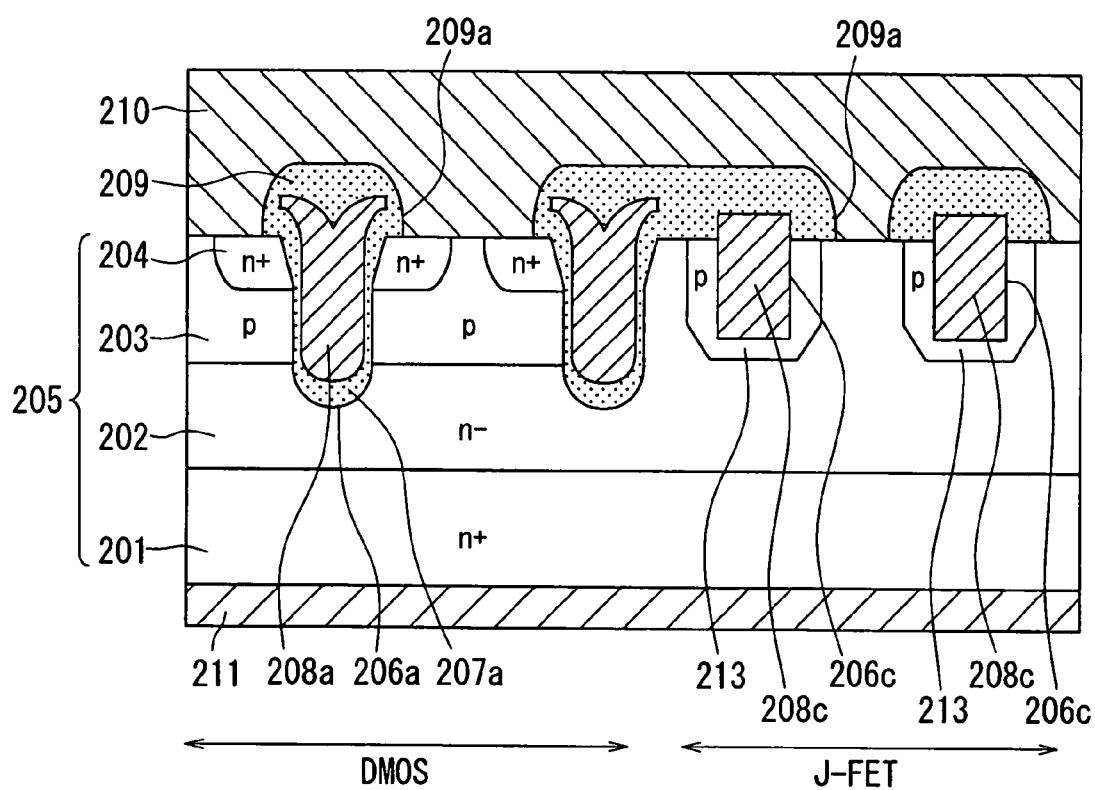
FIG. 24 shows a sectional structure of a semiconductor device according to a third embodiment which is equipped with a DMOS having a trench gate structure.
Figure 25A:
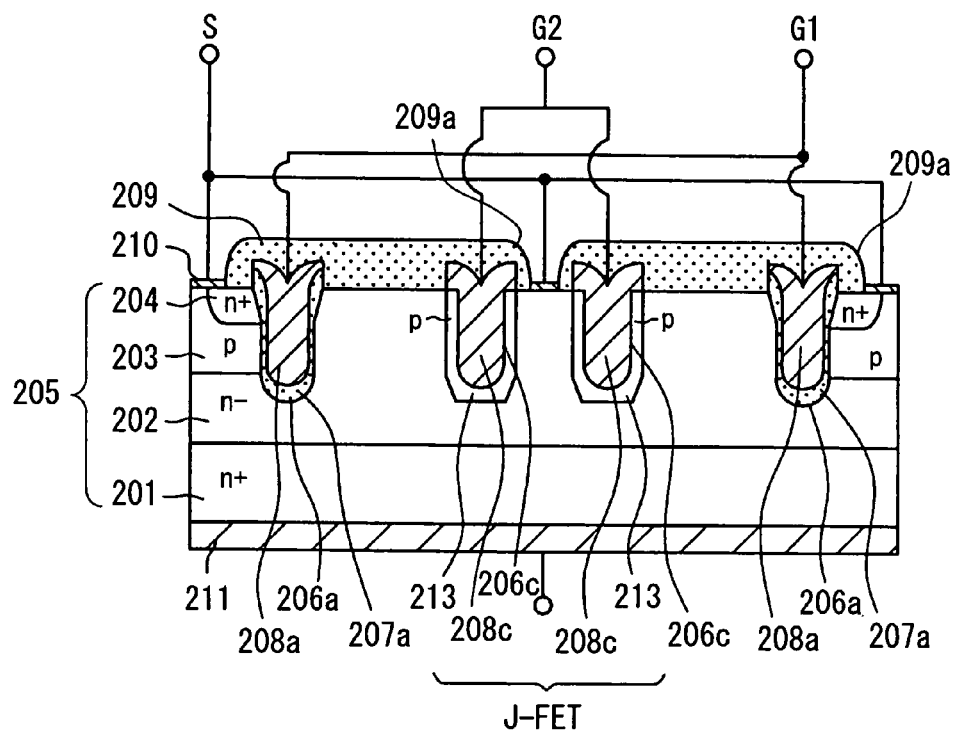
FIG. 25A is a schematic sectional view showing a wiring form of the semiconductor device of FIG. 24.
Figure 25B:
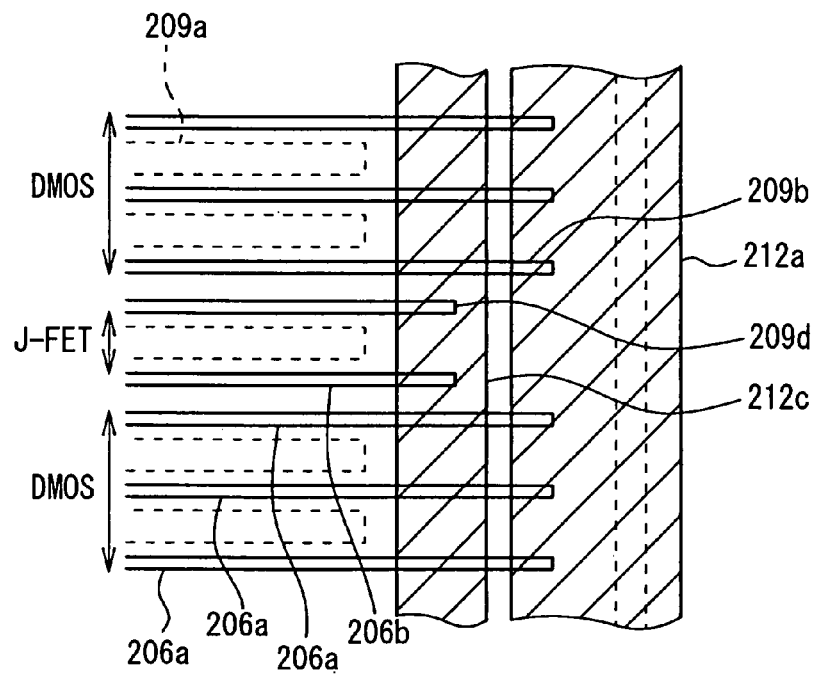
FIG. 25B shows its exemplary planar pattern.

FIG. 24 shows a sectional structure of a semiconductor device according to this embodiment which is equipped with a DMOS having a trench gate structure. FIG. 25A is a schematic sectional view showing a wiring form of the semiconductor device of FIG. 24, and 25B shows its exemplary planar pattern. The semiconductor device according to this embodiment is different from that according to the second embodiment only in that a J-FET is provided in place of the AccuFET. Therefore, only features that are different than in the second embodiment will be described.

The semiconductor device according to the embodiment is configured in such a manner that a DMOS having a trench gate structure and a J-FET are formed adjacent to each other in a single chip.

As shown in FIG. 24, second trenches 206c are formed in a J-FET forming region by digging the drift layer 202 from its surface. A p-type layer 213 is formed in a portion having a prescribed width around the inner wall surface of each second trench 206c, that is, in a portion of the drift layer 202 that surrounds each second trench 206c. Gate electrodes 208c are formed so as to be buried in the respective second trenches 206c.

In the semiconductor device having the above sectional structure, as shown in FIG. 25A, the gate electrodes 208a and the gate electrodes 8c are electrically connected to different gate interconnections 212a and 212c in cross sections that are different from FIG. 24. More specifically, as shown in FIG. 25B, the first trenches 206a and the second trenches 206c extend in the same direction in the form of stripes. One (in this embodiment, the first trenches 206a) of the first trenches 206a and the second trenches 206c project from the tips of the other (in this example, the second trenches 206c), and the gate electrodes 208a and the gate electrodes 208c are electrically connected to the different gate interconnections 212a and 212c via gate contact holes 209b and gate contact holes 9d that are formed through the BPSG film 209, respectively. To facilitate understanding of the layout of the gate interconnections 212a and 212c, the gate interconnections 212a and 212c are hatched in FIG. 25B though it is not a sectional view.

The semiconductor device which is equipped with the DMOS having the trench gate structure and the J-FET are constructed in the above-described manner. The structure can thus be obtained in which no body diode is formed in the region other than the DMOS forming regions, that is, in the J-FET forming region.

Next, the operation of the above-configured semiconductor device which is equipped with the DMOS having the trench gate structure and the J-FET will be described by using a circuit in which the semiconductor devices having the J-FET according to the embodiment and semiconductor devices having only a DMOS are arranged similarly to the arrangement of FIG. 21A.

Figure 26A:
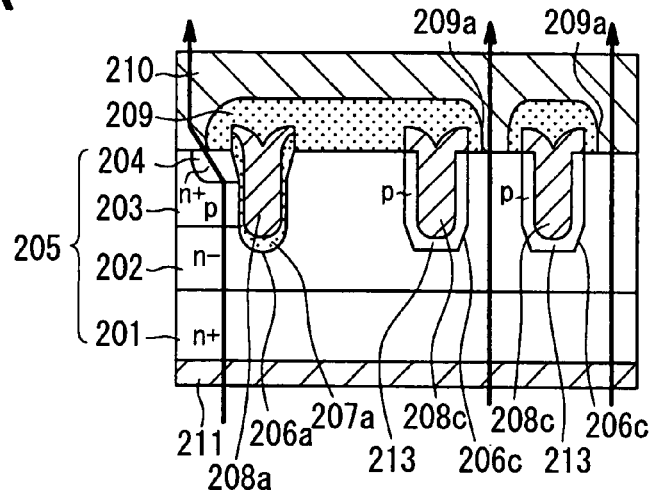
FIGS. 26A to 26C are schematic diagrams showing current paths of a case that the semiconductor devices of FIG. 24 are provided on the high side of an H-bridge circuit and the DMOSs are on/off-controlled by a PWM control.
Figure 26B:
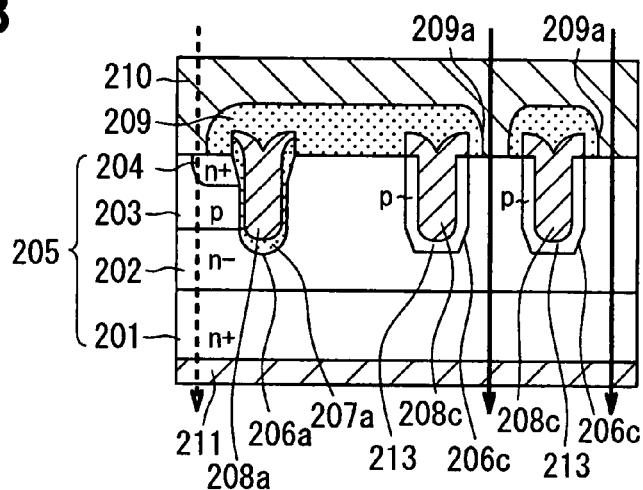
Figure 26C:
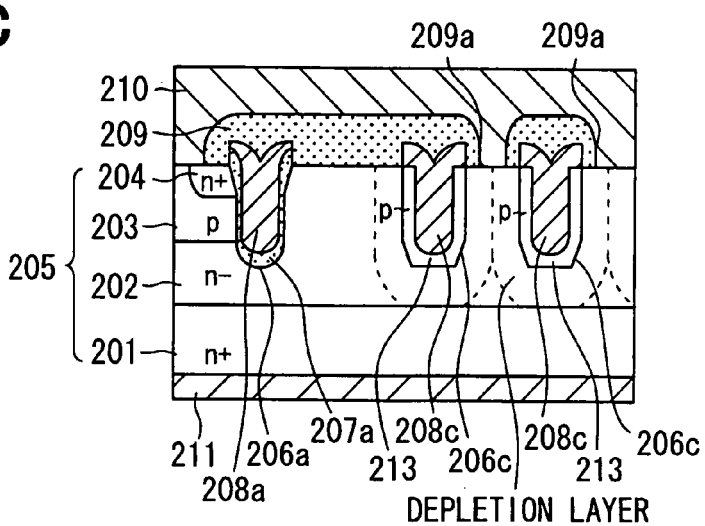

FIGS. 26A to 26C are schematic diagrams showing current paths of a case that the semiconductor devices of FIG. 24 are provided on the high side of an H-bridge circuit and the DMOSs are on/off-controlled by a PWM control. FIG. 26A shows current paths when a DMOS is on, FIG. 26B shows return current paths at an instant when the DMOS is turned off, and FIG. 26C shows current paths when the DMOS is off.

First, as shown in FIG. 26A, during the energization period, a current flows from the drain electrode 211 to the source electrode 210 as indicated by arrows in FIG. 26A. During the return period when the DMOS of a low-side semiconductor device is switched from on to off, as shown in FIG. 26B a current flows in the direction opposite to the direction in the energization period, that is, from the source electrode 210 to the drain electrode 211. At this time, since the J-FET is provided in addition to the DMOS and the voltage applied to the gate electrodes 208c of the J-FET of the high-side semiconductor device through which a return current is to flow is switched from low to high, a return current flows through the J-FET but almost no return current flows through the DMOS. As a result, the loss that is mainly due to Vf of the body diodes can be reduced.

When the flow of the return current is finished after the DMOS was switched from on to off, as shown in FIG. 26C the portion of the drift layer 202 between the p-type layers 213 of the J-FET is pinched off by depletion layers extending from the p-type layers 213 into the drift layer 202 and the current path leading to the drift layer 202 is interrupted. In this manner, current flow can be prevented while the DMOS and the J-FET are off. Current leakage can thus be prevented while the J-FET is off.

As described above, the semiconductor device according to the embodiment is configured in such a manner that not only the DMOS but also the J-FET is formed in the single chip. Therefore, a return current is allowed to flow through the J-FET rather than the DMOS, which provides the advantage that the loss that is mainly due to Vf of the body diodes can be reduced.

Next, a manufacturing method of the above-configured semiconductor device will be described with reference to process diagrams of FIGS. 27A to 27H. The manufacturing method of the semiconductor device according to this embodiment is the same as that according to the second embodiment as far as the process for forming the DMOS is concerned. Therefore, a process for forming the J-FET, which is different than in the second embodiment, will mainly be described below.

First, steps of FIGS. 27A to 27D are executed which are the same as the steps of FIGS. 23A to 23D according to the second embodiment. Trench gates are thereby formed in the DMOS forming regions.

Figure 27A:
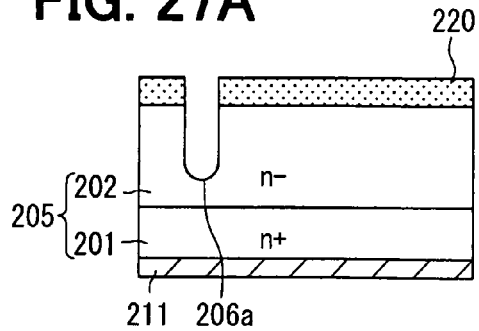
FIGS. 27A to 27H are sectional views showing a manufacturing process of the semiconductor device of FIG. 24.
Figure 27B:
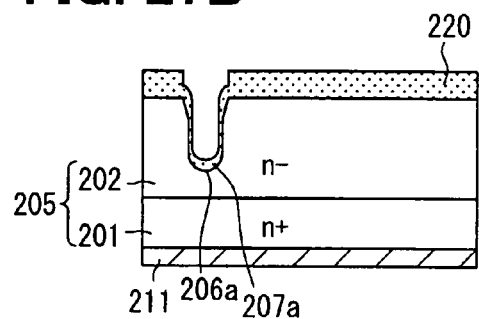
Figure 27C:
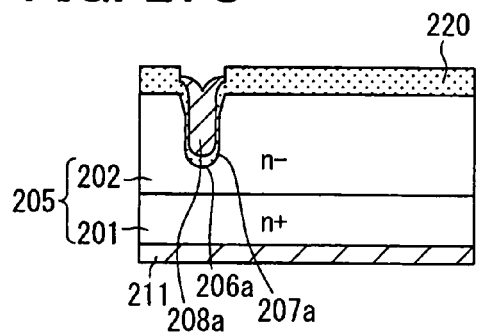
Figure 27D:
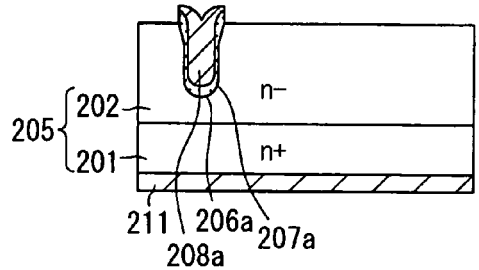
Figure 27E:
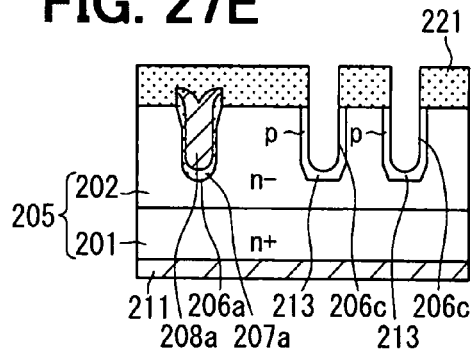

In a step of FIG. 27E, a silicon oxide film 221 to become a mask is deposited by CVD on the drift layer 202 including the trench gates and then patterned by photolithography and dry etching, whereby openings are formed through the silicon oxide film 221. Then, second trenches 6c are formed in the drift layer 202 in the J-FET forming region by anisotropic dry etching with the thus-patterned silicon oxide film 221 used as a mask. Then, p-type layers 13 are formed so as to surround the trenches 6c by, for example, oblique ion implantation using the silicon oxide film 221 as a mask.

Figure 27F:
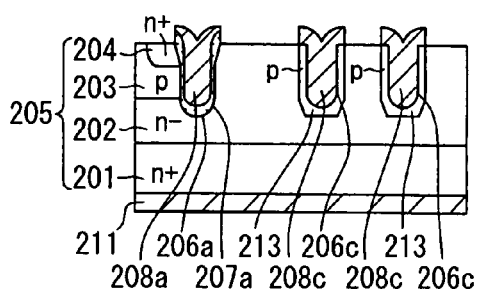
Figure 27G:
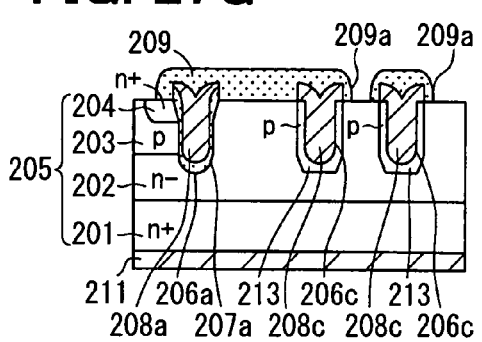
Figure 27H:
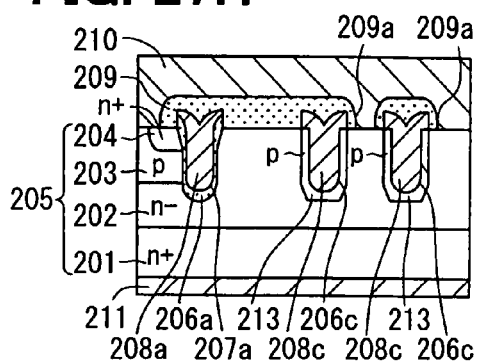
Figure 28:
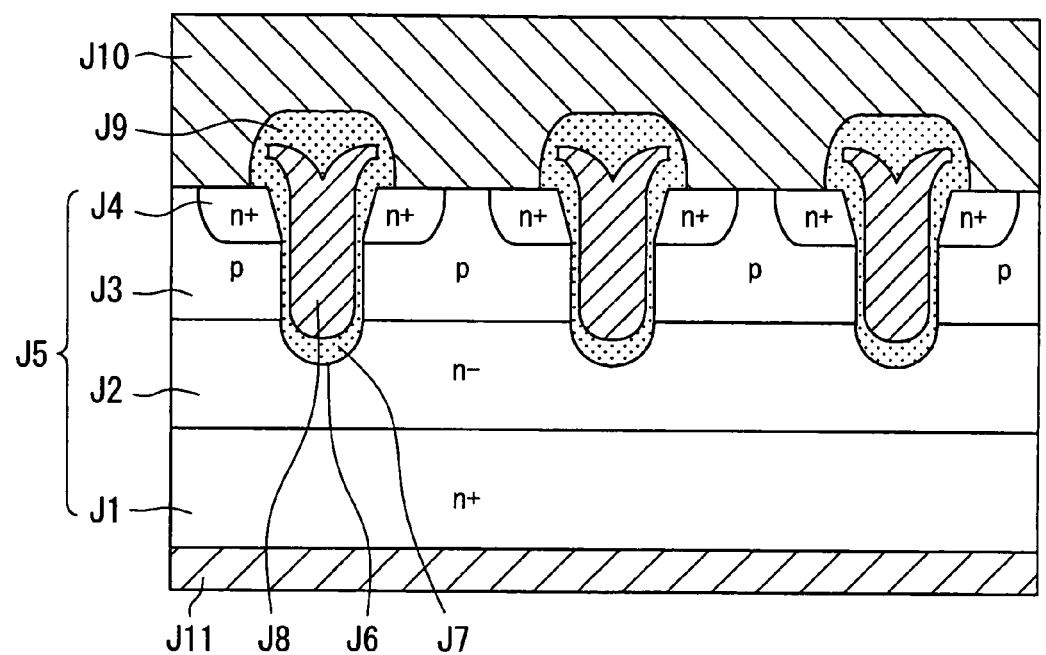
FIG. 28 is a sectional view of a conventional semiconductor device which is equipped with a vertical MOSFET having a trench gate structure.

In a step of FIG. 27F, gate electrodes 208c are formed with doped poly silicon in the same manner as in the step of FIG. 23C. Then, after the silicon oxide film 221 is removed, a step that is the same as the step of FIG. 23E of the second embodiment is executed, whereby base layers 203 and source regions 204 are formed. Then, steps of FIGS. 27G and 27H are executed which are the same as the steps of FIG. 23F and 23G of the second embodiment, respectively. Finally, a drain electrode 11 is formed on the back surface of the silicon substrate 201. The semiconductor device of FIG. 24 in which the DMOS having the trench gate structure and the J-FET are formed is completed.

Other Embodiments

Although the above embodiments are directed to the case of using the n-channel transistor having the trench gate structure, naturally the embodiments can also be applied to a case of using a p-channel transistor in which the conductivity types of the individual portions are opposite to those of the embodiments.

Although the above embodiments are directed to the case that the vertical MOSFET is a DMOS having a trench gate structure, the same advantages as described above can be obtained by forming an AccuFET or a J-FET together with a planar DMOS or an LDMOS.

The third embodiment is directed to the case that the gate electrodes 8c of the J-FET are made of doped polysilicon. Alternatively, for example, trench gates may be formed by forming, in the drift layer 202, trenches 206c and p-type layers 213 surrounding the respective trenches 206c and then forming metal layers such as tungsten plugs in the respective trenches 206c. In this case, the metal layers may be formed with tungsten in a later step of forming interconnections.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor substrate having a first conductive type, wherein the substrate has a principal surface and a backside surface, and wherein the substrate includes an inner region and a periphery region;
a vertical type trench gate MOS transistor disposed in a surface portion of the principal surface in the inner region of the substrate;
a Schottky barrier diode disposed in another surface portion of the principal surface in the inner region of the substrate;
a plurality of trenches disposed on the principal surface of the substrate; and
a poly silicon film filled in each trench of the plurality of trenches through an insulation film between the poly silicon film and an inner wall of each trench of the plurality of trenches, wherein
the plurality of trenches have a stripe pattern without crossing each other so that the inner region on the principal surface of the substrate is divided into a plurality of separation regions by the plurality of trenches,
the plurality of separation regions includes a first separation region and a second separation region,
the first separation region includes a first conductive type region and a second conductive type layer disposed on the principal surface of the substrate,
the second conductive type layer provides a channel region of the MOS transistor,
the first conductive type region is disposed on a surface portion of the second conductive type layer, and adjacent to a first trench of the plurality of trenches,
the first conductive type region provides a source of the MOS transistor,
the poly silicon film in the first trench is coupled with a gate wiring of the MOS transistor,
the plurality of trenches further includes a second trench, which is not adjacent to the first conductive type region,
the poly silicon film in the second trench is coupled with a source wiring or the gate wiring of the MOS transistor,
the substrate in the second separation region is exposed on the principal surface in such a manner that the substrate is coupled with the source wiring of the MOS transistor,
the source wiring and the substrate in the second separation region provide a Schottky barrier in the Schottky barrier diode,
the first separation region has a first width between a first two adjacent trenches of the plurality of trenches,
the second separation region has a second width between a second two adjacent trenches,
the plurality of trenches further includes at least two third trenches,
the third trenches are connected between the second two adjacent trenches so that the second two adjacent trenches and the third trenches provide a ladder structure,
the second separation region is divided into a plurality of separation portions each bounded by the at least two third trenches and the second two adjacent trenches, and
the first separation region has a first length, in a direction perpendicular to the second width, the first length being on the principal surface of the substrate,
the plurality of separation portions of the second separation region having a total length, in a direction perpendicular to the second width, the total length being on the principal surface of the substrate,
the first length being longer than the total length.

2. The semiconductor device according to claim 1, wherein
the source wiring is made of a first metallic layer, which covers a surface portion of the principal surface of the substrate, and
the gate wiring is made of a second metallic layer, which surrounds the first metallic layer.

3. The semiconductor device according to claim 1, wherein the poly silicon film in the second trench is coupled with the source wiring of the MOS transistor.

4. The semiconductor device according to claim 3, further comprising:
a poly silicon layer disposed on the principal surface in the periphery region of the substrate.

5. The semiconductor device according to claim 3, further comprising:
a first metallic layer for providing the source wiring, wherein
the first metallic layer is disposed on the first and second conductive type regions in the first separation region, the poly silicon film in the second trench, and the substrate in the second separation region so that they are commonly coupled with the first metallic layer.

6. The semiconductor device according to claim 1, further comprising:
a poly silicon layer disposed on the principal surface in the periphery region of the substrate.

7. The semiconductor device according to claim 1, wherein
the first and second separation regions are alternately arranged so that the second separation region is sandwiched between the first separation region and another first separation region.

8. The semiconductor device according to claim 1, wherein
the stripe pattern is a linear stripe pattern.

9. The semiconductor device according to claim 8, wherein
the plurality of trenches is in parallel with each other.

10. The semiconductor device according to claim 9, wherein
the first width is equal to the second width.

11. The semiconductor device according to claim 9, wherein
the second width is smaller than the first width.

12. The semiconductor device according to claim 1, wherein
each separation portion has a square shape.

13. The semiconductor device according to claim 1, wherein
a part of the insulation film between the poly silicon film and a bottom of each trench has a thickness, which is larger than a thickness of another part of the insulation film between the poly silicon film and a side wall of each trench.

14. The semiconductor device according to claim 1, wherein
a bottom portion of each trench has a curvature radius, which is larger than a width of a top portion of each trench.

15. The semiconductor device according to claim 1, wherein
the first conductive type is a N conductive type, and the second conductive type is a P conductive type.

16. The semiconductor device according to claim 1, wherein
the semiconductor device provides an inverter circuit, and the Schottky barrier diode provides a free wheel diode.

17. The semiconductor device according to claim 1, wherein
the semiconductor device is mounted on a vehicle.

* * * * *